United States Patent
Ghosh et al.

(10) Patent No.: US 10,014,864 B2
(45) Date of Patent: Jul. 3, 2018

(54) WIDE OPERATING LEVEL SHIFTERS

(71) Applicants: Swaroop Ghosh, Tampa, FL (US);
Kenneth Ramclam, Port Charlotte, FL (US)

(72) Inventors: Swaroop Ghosh, Tampa, FL (US);
Kenneth Ramclam, Port Charlotte, FL (US)

(73) Assignee: UNIVERSITY OF SOUTH FLORIDA, Tampa, FL (US)

( * ) Notice: Subject to any disclaimer, the term of this patent is extended or adjusted under 35 U.S.C. 154(b) by 0 days.

(21) Appl. No.: 15/586,888

(22) Filed: May 4, 2017

(65) Prior Publication Data

US 2017/0237439 A1 Aug. 17, 2017

Related U.S. Application Data

(62) Division of application No. 14/925,164, filed on Oct. 28, 2015, now Pat. No. 9,673,821.

(Continued)

(51) Int. Cl.
*H03L 5/00* (2006.01)
*H03K 19/0185* (2006.01)
(Continued)

(52) U.S. Cl.
CPC .. *H03K 19/018521* (2013.01); *G11C 11/4087* (2013.01); *G11C 11/4094* (2013.01)

(58) Field of Classification Search
CPC ............. H03K 3/356; H03K 19/00315; H03K 17/102; H03K 3/012
(Continued)

(56) References Cited

U.S. PATENT DOCUMENTS 6,750,695 B2    6/2004   Blodgett et al.
6,803,632 B2 * 10/2004   Kato .................... H01L 27/0266
                                            257/357

(Continued)

FOREIGN PATENT DOCUMENTS

WO     2012/087473     6/2012

OTHER PUBLICATIONS

Rusu et al., A 65-nm Dual-Core Multithreaded Xeon® Processor With 16-MB L3 Cache, IEEE Journal of Solid-State Circuits, vol. 42, No. 1, Jan. 2007.

(Continued)

*Primary Examiner* — Dinh T Le
(74) *Attorney, Agent, or Firm* — Thomas | Horstemeyer, LLP.

(57) ABSTRACT

Aspects of wide operating range level shifter designs are described. One embodiment includes a level shifter configured to receive an input signal in a first voltage domain and generate an output signal in a second voltage domain, a pulse generator configured to generate a pulse in response to sensing a rise transition on the input signal, and a droop circuit configured to decouple at least a portion of the level shifter from the second voltage domain in response to the pulse. According to one aspect of the embodiments, the pulse can be provided to the droop circuit to decouple at least a portion of the level shifter from the second voltage domain and reduce contention between transistors in the level shifter. Using the concepts described herein, the worst case rise time delay for level shifters can be significantly reduced.

20 Claims, 19 Drawing Sheets

Related U.S. Application Data

(60) Provisional application No. 62/069,425, filed on Oct. 28, 2014.

(51) Int. Cl.
  *G11C 11/408* (2006.01)
  *G11C 11/4094* (2006.01)

(58) Field of Classification Search
  USPC .................. 327/306, 333; 326/61–62, 80–82
  See application file for complete search history.

(56) References Cited

U.S. PATENT DOCUMENTS

| | | | | |
|---|---|---|---|---|
| 6,842,043 | B1 * | 1/2005 | Nguyen | H03K 3/356113 326/68 |
| 7,233,468 | B2 * | 6/2007 | Chang | H02H 9/046 361/56 |
| 7,541,837 | B2 | 6/2009 | Lines | |
| 7,855,757 | B2 | 12/2010 | Lee et al. | |
| 2014/0354342 | A1 | 12/2014 | Lou | |
| 2015/0295561 | A1 | 10/2015 | Malkov | |

OTHER PUBLICATIONS

Diodato, Philip W., Embedded DRAM: More than Just a Memory, Circuits for Communications, IEEE Communications Magazine Jul. 2000.

Somasekhar et al., Multi-Phase 1 GHz Voltage Doubler Charge Pump in 32 nm Logic Process, IEEE Journal of Solid-State Circuits, vol. 45, No. 4, Apr. 2010.

Vattikonda et al., Modeling and Minimization of PMOS NBTI Effect for Robust Nanometer Design, DAC '06 Proceedings of the 43rd annual Design Automation Conference, Jul. 2006.

Tran et al., Low-power high-speed level shifter design for block-level dynamic voltage scaling environment, 2005 International Conference on Integrated Circuit Design and Technology, May 2005.

Kulkarni, Sarvesh H., High Performance Level Conversion for Dual VDD Design, IEEE Transactions on Very Large Scale Integration (VLSI) Systems, vol. 12, No. 9, Sep. 2004.

Raychowdhury et al., PVT-and-Aging Adaptive Wordline Boosting for 8T SRAM Power Reduction, 2010 IEEE International Solid-State Circuits Conference—(ISSCC).

Ishihara, et al., Level Conversion for Dual-Supply Systems, IEEE Transactions on Very Large Scale Integration (VLSI) Systems, vol. 12, No. 2, Feb. 2004.

Chang, et al., Robust Level Converter for Sub-Threshold/Super-Threshold Operation:100 mV to 2.5 V, IEEE Transactions on Very Large Scale Integration (VLSI) Systems, vol. 19, No. 8, Aug. 2011.

Osaki, Yuji, A Low-Power Level Shifter With Logic Error Correction for Extremely Low-Voltage Digital CMOS LSIs, IEEE Journal of Solid-State Circuits, vol. 47, No. 7, Jul. 2012.

Kim et al., LC2: Limited Contention Level Converter for Robust Wide-Range Voltage Conversion, Dig. Symp. VLSI Circuits, 2011.

Ramclam et al., Design and Analysis of Robust and Wide Operating Low-Power Level-Shifter for Embedded Dynamic Random Access Memory, GLSVLSI '14 Proceedings of the 24th edition of the great lakes symposium on VLSI, May 2014.

\* cited by examiner

WIDE OPERATING LEVEL SHIFTERS

CROSS-REFERENCE TO RELATED APPLICATIONS

This application is a Divisional of U.S. Non-Provisional application Ser. No. 14/925,164, filed Oct. 28, 2015, and claims the benefit of U.S. Provisional Application No. 62/069,425, filed Oct. 28, 2014, the entire contents of both of which applications are hereby incorporated herein by reference.

BACKGROUND

Integrated circuits often include multiple circuit arrangements or components to achieve different functions, such as execution units, memory arrays, and signal decoders, for example. Two or more of these components can operate at different supply voltages and signal levels. For example, execution units may require higher supply voltages and signal levels relative to signal decoders. When components operating at different voltage supplies communicate with each other, the signals can create static currents in integrated circuits. Voltage level shifters can be used in these systems to permit components operating at different voltage supplies to communicate with each other without (or with less) static currents.

BRIEF DESCRIPTION OF THE DRAWINGS

For a more complete understanding of the embodiments and the advantages thereof, reference is now made to the following description, in conjunction with the accompanying figures briefly described as follows.

Figure 1A:
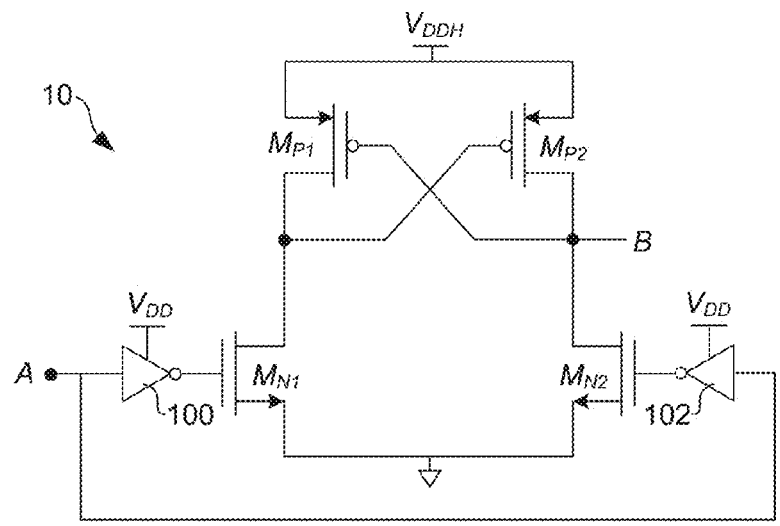
FIG. 1A is a schematic diagram of an example level shifter for discussion of aspects of the embodiments.

The drawings illustrate only example embodiments and are therefore not to be considered limiting of the scope described herein, as other equally effective embodiments are within the scope and spirit of this disclosure. The elements and features shown in the drawings are not necessarily drawn to scale, emphasis instead being placed upon clearly illustrating the principles of the embodiments. Additionally, certain dimensions may be exaggerated to help visually convey certain principles. In the drawings, similar reference numerals between figures designate like or corresponding, but not necessarily the same, elements.

DETAILED DESCRIPTION

Level shifters can be used in various types of integrated circuits. For example, level shifters can be used in an embedded dynamic random access memory (eDRAM) array where bit cell circuits operate on high supply voltages and peripheral circuits operate on low supply voltages. In this regard, eDRAM arrays may rely upon level shifters to convert signal voltages when the bit cell circuits communicate with the peripheral circuits. However, there can be wide variability between the high voltages of the bit cell circuits and the low voltages of the peripheral circuits. Due in part to that wide variability, some eDRAM level shifters operate with relatively large delay times which can lead to eDRAM malfunction.

Thus, the correct design of level shifters can be important when an integrated circuit is segregated into multiple voltage domains. Level shifters can be used at voltage domain interfaces to mitigate sneak path currents and in high voltage drivers where voltage boosting is needed for performance. In eDRAMs, for example, level shifters can be employed in wordline paths between voltage domains. However, if level shifters leak charge, wordline voltages can drop and affect the speed and retention time of eDRAMs. Further, the delay of level shifters under worst case process corners can cause functional discrepancies.

In the context outlined above, the embodiments described herein are directed to level shifters having improved operating characteristics. One embodiment includes a pulsed level shifter with supply gating to address some drawbacks in conventional level shifters. In that context, the embodiments described herein include a level shifter that incorporates a pulse generator and droop circuit. The pulsed level shifter can improve the speed of level shifters in certain operating scenarios. Further, as described herein, power-gating for level shifters can improve retention time and bandwidth with minimal power and area overhead. In another embodiment, a pulsed level shifter can be embedded in a self-contained collapsed level shifter for applications in isolated level shifters, such as level shifters used at voltage boundaries, for example.

Supply voltage scaling can reduce power consumption in integrated circuits to control both dynamic and leakage power consumption. Since the optimal voltage for each part could be different, the integrated circuit die can be segregated into several voltage domains. For example, cache voltage can be higher than core voltage. Level shifters can be needed whenever a voltage domain is crossed. However, it may be desirable to limit the number of level shifters in the die to a few thousand. The power and performance of level shifters in such systems with a limited number of level shifters can be a significant engineering problem.

Various embodiments of a low power, robust level shifter system for use in memories and other integrated circuits are described herein. The level shifter systems can utilize a pulse generator configured to generate a pulse in response to sensing a rise transition on an input signal. The level shifter system can also utilize a droop circuit configured to disconnect a portion of the level shifter from a high voltage supply in response to the pulse. The level shifter systems can also enable a higher retention time relative to conventional level shifters. The embodiments also include a self-collapsing level shifter that can be employed at voltage domain interfaces. The self-collapsing level shifter can include an embedded drooping mechanism that decouples the self-collapsing pulsed level shifter from a voltage supply in response to sensing a transition on an input signal.

In one embodiment, the level shifters described herein can be employed in an eDRAM or other memory device. In such an embodiment, the eDRAM can share the droop circuit and the pulse generator among about 64 level shifters to reduce the area overhead associated with the droop circuit and the pulse generator. In other embodiments, the pulse generator and the droop circuit can be employed for other numbers of level shifters. The level shifters can also operate when there is wide variation in voltages that need to be converted. When used in an eDRAM or other memory device, the level shifters can be employed in a wordline driver path. For example, the level shifters can be employed in both wordline predecoders (typically located in the row driver) and wordline enables (typically located in the timer).

In memory devices, the voltage supply $V_{DDH}$, which may be provided by one or more charge pumps, can vary over time based on certain factors, including process, voltage, and temperature (PVT) variables and load current. Both charge pump output and load current can vary over time due to PVT fluctuations and have a cumulative impact on $V_{DDH}$ variation. Thus, the design of level shifters can involve (a) tight area budget as the level shifter should fit within the array with a minimum area overhead, (b) protected design to avoid reliability degradation, and (c) reduced leakage to alleviate the burden on charge pumps and save standby power.

The traditional ways of mitigating transistor contention in conventional level shifters results in a large area overhead which is not suitable for the mitigation of contention in eDRAM wordline selection, for example. The present disclosure describes a wide operating level shifter with a shared droop circuit for embedded memory and other applications that is designed to operate at a wide range of supply voltages.

An example 32 MB eDRAM array can contain about 128 banks each with 256 KB capacity. Each bank consists of 8 subarrays. Each subarray can contain 256 rows and 1024 columns. A raw address can be predecoded into high, mid, and low outside the array and shipped to the subarrays for further decoding. The wordline selection can be based on predecoded addresses, wordline enabling, and subarray selection. A level shifter can be present in a wordline driver after the predecoding stage as well as in the timer. A total number of level shifters per bank can be about 544 (i.e., ((256/4)+4)×8). For a 32 MB array, the total number of level shifters can be about 69632 (i.e., 544×128). The high voltage circuitries including wordline driver and level shifters can be supported by a dedicated charge pump. The charge pump load can contain the leakage power of idle banks and active power of selected banks.

eDRAM access modes can be bandwidth dependent. For example, a first access mode can be suitable for low bandwidth while another access mode can be suitable for high bandwidth. Furthermore, bank accesses can be interleaved to avoid supply droop. The $V_{DDH}$ load current can be given by the summation of dynamic current drawn by the high voltage circuitries of active banks and the leakage power of inactive banks. For the first access mode, leakage power can dominate the total load, whereas in second access mode, dynamic power also becomes significant.

If a number of charge pumps per 32 MB memory array is N and the supply voltage is $V_{DD}$, then the output voltage can be given by $$V_{DDH} = 2V_{DD} - \left(\frac{I_{load}}{N}\right)\left(\frac{\Delta}{5.2 \times 10^{-3}}\right) \quad (1)$$

where $\Delta$=0.5 (1.2) for f/2 (f/8). Thus, $V_{DDH}$ can droop significantly due to increases in load current.

Multiple charge pumps can be employed to compensate for larger load. However, the downside to using multiple charge pumps (increasing N) can be two-fold, including (a) area overhead and (b) the possibility of high voltage at the high voltage circuits which can experience reliability degradation.

Read operations in eDRAM can be destructive due to charge sharing between bitcell, bitline, and writeback. The writeback voltage can depend on wordline voltage since NMOS access transistors cannot pass a full high signal which in turn can depend on $V_{DDH}$. Degradation in writeback voltage can be manifested as poor retention time (i.e., the maximum amount of time before which the bitcell can be read correctly).

A challenge of designing level shifters can be to ensure robustness across $V_{DDH}$, process skews, and random variations. For example, the design requirements for $V_{DDH}=V_{DDH}(min)$ may conflict with the design for $V_{DDH}=V_{DDH}(max)$. Similarly, the designs for certain process corners could conflict with each other.

Turning to the drawings, FIG. 1A is a schematic diagram of an example level shifter 10 for discussion of aspects of the embodiments. The level shifter 10 is configured to receive an input signal A in a first voltage domain and generate an output signal B in a second voltage domain. The first voltage domain is supplied at the voltage $V_{DD}$ and the second voltage domain is supplied at the voltage $V_{DDH}$. In the example shown in FIG. 1A, the voltage $V_{DD}$ is a nominal voltage and the voltage $V_{DDH}$ is a higher voltage. Thus, the level shifter 10 is configured to shift the logic levels of logic signals from a lower first voltage domain to a higher second voltage domain. The level shifter 10 can also be relied upon to shift logic levels from higher voltage domains to lower voltage domains.

The level shifter 10 includes a first level shifter output leg and a second level shifter output leg. The first level shifter output leg includes the first PMOS transistor $M_{P1}$ and the first NMOS transistor $M_{N1}$, and the second level shifter output leg includes the second PMOS transistor $M_{P2}$ and the second NMOS transistor $M_{N2}$. An output can be taken at the node B along the second level shifter output leg. The inverters 100 and 102 are placed between the input signal A and the gate terminals of the transistors $M_{N1}$ and $M_{N2}$. The inverters 100 and 102 can be omitted in some cases, such as if an inverting level shifter output is desired, or the output can be taken along the first level shifter output leg between the transistors $M_{P1}$ and $M_{N1}$.

The transistors $M_{P1}$, $M_{N1}$, $M_{P2}$, and $M_{N2}$ can be embodied as metal oxide semiconductor field effect transistors (MOSFETs) or any other transistors suitable for the application of level shifting. The sizes (e.g., length, width, etc.) of each of the transistors $M_{P1}$, $M_{N1}$, $M_{P2}$, and $M_{N2}$, respectively, can vary among the embodiments.

The level shifter 10 is relatively simple and symmetrical in nature. Because it is symmetrical, the level shifter 10 can experience contention in both directions of level transitions. The sizes of the PMOS transistors $M_{P1}$ and $M_{P2}$ can be kept relatively small. At the same time, the NMOS transistors $M_{N1}$ and $M_{N2}$ can be larger and sized to be strong enough to win the contention with the PMOS transistors $M_{P1}$ and $M_{P2}$ over $V_{DDH}$ voltages and process skews. For example, the NMOS transistors $M_{N1}$ and $M_{N2}$ can be sized about 5 times larger than the PMOS transistors $M_{P1}$ and $M_{P2}$ to ensure robustness across process corners.

Figure 1B:
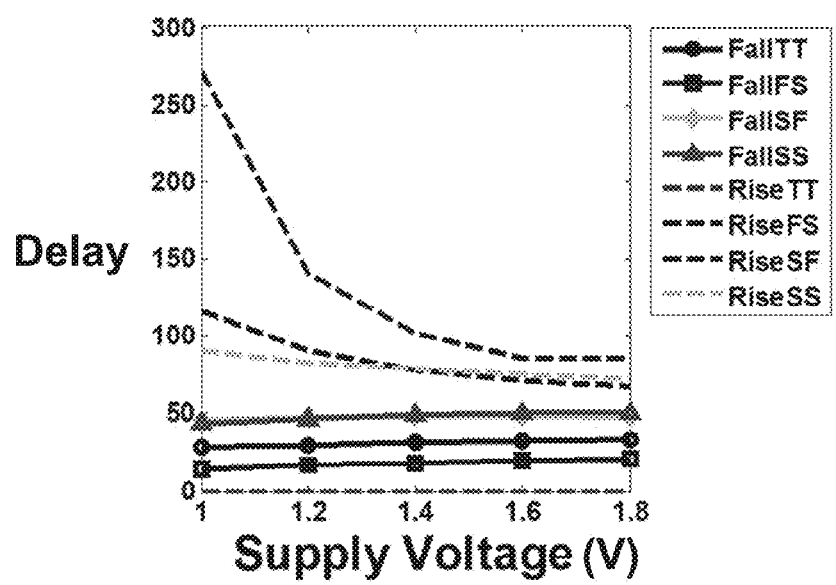
FIG. 1B is an example graph of simulated rise and fall delays for the level shifter shown in FIG. 1A.

FIG. 1B is an example graph of simulated rise and fall delays for the level shifter 10 shown in FIG. 1A. The simulations were carried out with a predictive 22 nm model. Fast corners were modeled by reducing 150 mV in the transistor threshold voltage $V_{TH}$, and slow corners were modeled by adding 150 mV in $V_{TH}$. Five process corners were simulated, including typical NMOS and PMOS transistors (TT), fast NMOS and slow PMOS transistors (FS), slow NMOS and fast PMOS transistors (SF), slow NMOS and slow PMOS transistors (SS), and fast NMOS and fast PMOS transistors (FF).

FIG. 1B shows the ($\mu+4.5\sigma$) rise and fall delays obtained using a Monte Carlo simulation for all process corners. As shown, the rise delay can be worse when $V_{DDH}$ is low and the PMOS transistors are slow (e.g., at SS and FS corners). At higher voltages (and at the SF corner), the fall delay can be worse because of stronger PMOS transistors. FIG. 1B reveals the challenge in designing the level shifter 10 to operate over a wide range of voltages without impacting propagation delay in level shifting.

Figure 2A:
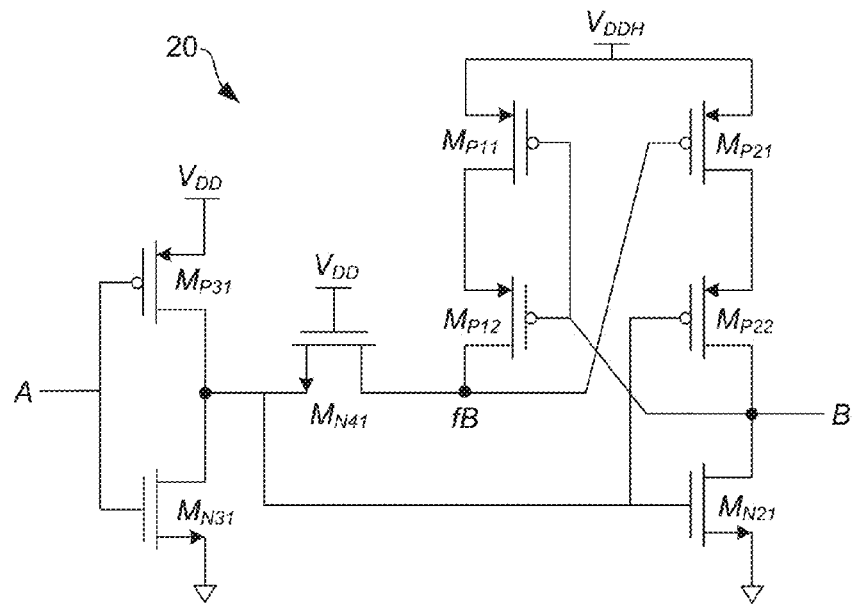
FIG. 2A is a schematic diagram of another example level shifter for discussion of aspects of the embodiments.

FIG. 2A is a schematic diagram of another example level shifter 20 for discussion of aspects of the embodiments. The level shifter 20 is configured to receive an input signal A in a first voltage domain and generate an output signal B in a second voltage domain. The first voltage domain is supplied at the voltage $V_{DD}$ and the second voltage domain is supplied at the voltage $V_{DDH}$. In the example shown in FIG. 2A, the voltage $V_{DD}$ is a nominal voltage and the voltage $V_{DDH}$ is a higher voltage. Thus, the level shifter 20 is configured to shift the logic levels of logic signals from a lower first voltage domain to a higher second voltage domain. The level shifter 20 can also be relied upon to shift logic levels from higher voltage domains to lower voltage domains.

The level shifter 20 includes a first level shifter output leg and a second level shifter output leg. The first level shifter output leg includes the transistors $M_{P11}$ and $M_{P12}$, and the second level shifter output leg includes the transistors $M_{P21}$, $M_{P22}$, and $M_{N21}$. The level shifter 20 also includes a pair of input transistors $M_{P31}$ and $M_{N31}$ and a pass transistor $M_{N41}$ as shown in FIG. 2A. An output of the level shifter 20 can be taken at the node B along the second level shifter output leg. The transistors in the level shifter 20 can be embodied as MOSFET or any other suitable transistors for the application of level shifting. The sizes (e.g., length, width, etc.) of the respective transistors in the level shifter 20 can vary among the embodiments.

Based on its design, the level shifter 20 can have relatively lower overhead as compared to the level shifter 10 in FIG. 1A. The sizes of the transistors in the level shifter 20 can be selected with an aim to provide stability and robustness under all process and voltage conditions, although it may be necessary to settle on a compromise for performance among the conditions. Compared to the level shifter 10, the level shifter 20 experiences contention in only one direction. For example, contention may exist between the transistors $M_{P11}$ and $M_{P12}$ and/or the transistors $M_{N41}$ and $M_{N31}$, particularly at the at SF corner when $V_{DDH}$ is near a maximum. Those transistors can be sized so that the transistors $M_{N41}$ and $M_{N31}$ overcome the transistors $M_{P11}$ and $M_{P12}$ and the node fB is pulled down to turn $M_{P11}$ and $M_{P12}$ ON (for fast rise delay). The same sizing can conflict exists when $V_{DDH}$ is near a minimum and $M_{P11}$ and $M_{P12}$ are too weak to pull the node fB to turn $M_{P21}$ and $M_{P22}$ OFF. This can result in a contention between the pair of transistors $M_{P21}$ and $M_{P22}$ and the transistor $M_{N21}$ as both are ON simultaneously (slow fall delay). These conflicting requirements can be considered for sizing the level shifter 20.

Figure 2B:
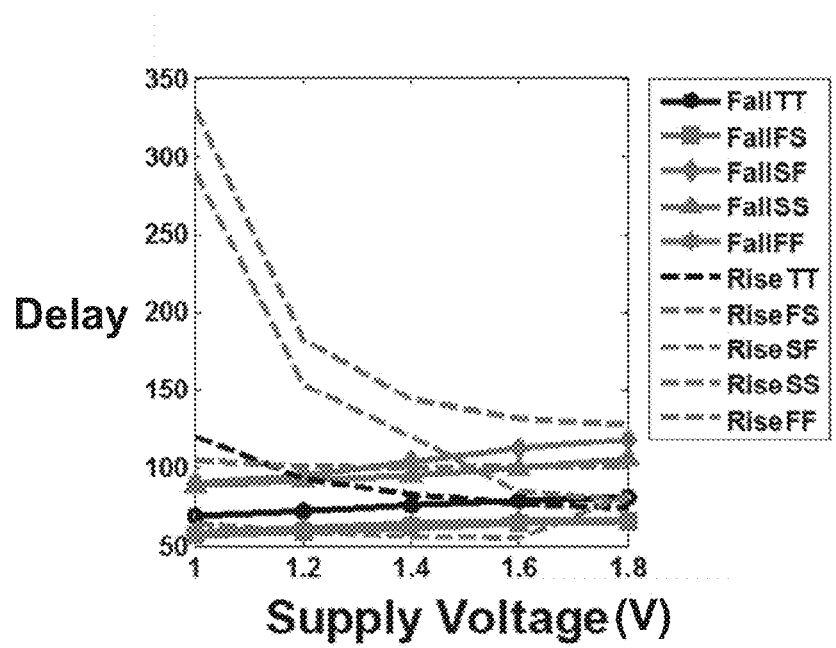
FIG. 2B is an example graph of simulated rise and fall delays for the level shifter shown in FIG. 2A.
Figure 2C:
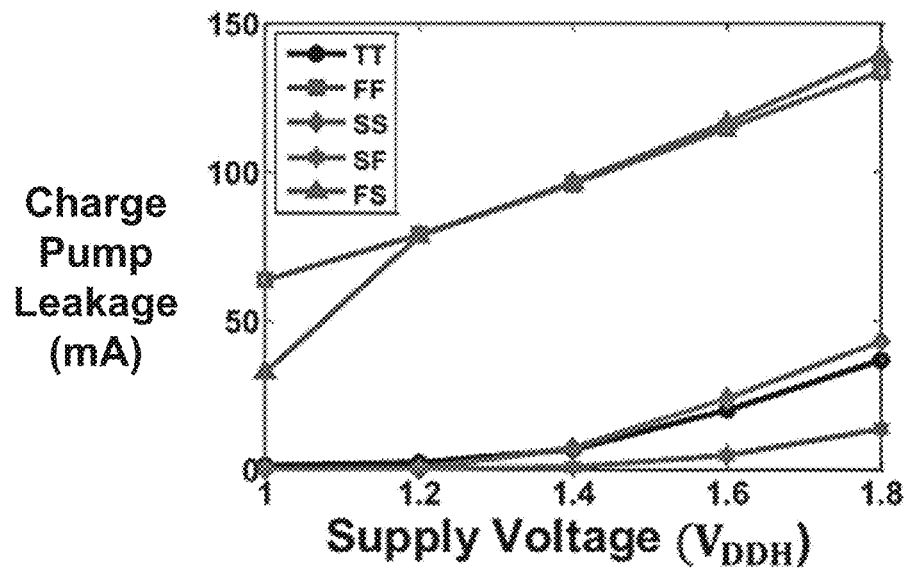
FIG. 2C is a graph showing an example of charge pump leakage versus supply voltage for the level shifter shown in FIG. 2A.
Figure 2D:
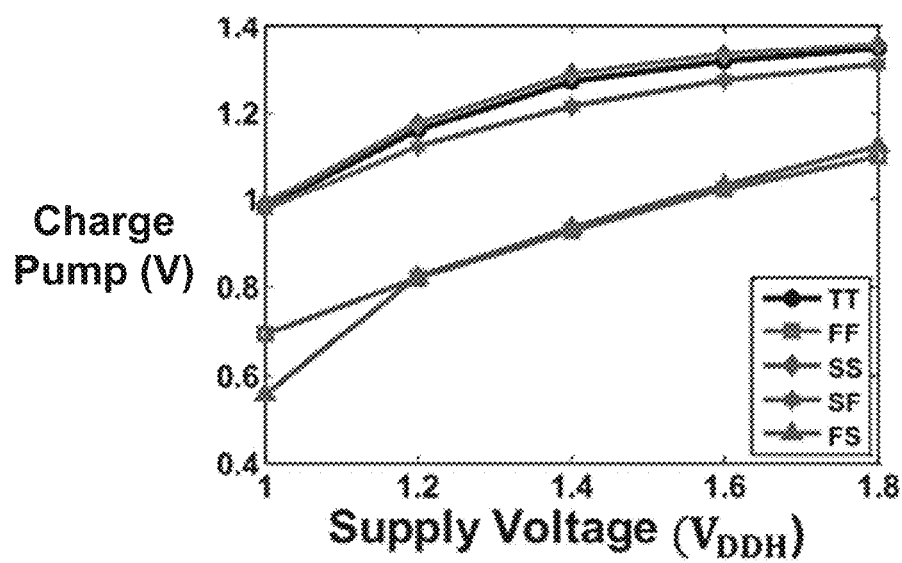
FIG. 2D is a graph showing an example of actual supply voltage received from a charge pump for different process corners of the level shifter shown in FIG. 2A.

FIG. 2B is an example graph of simulated rise and fall delays for the level shifter 20 shown in FIG. 2A. As shown, the rise delay can be worse at low $V_{DDH}$, whereas fall delay can be worse at high $V_{DDH}$ (e.g., at SS corner). This can be the outcome of weak NMOS and relatively strong PMOS transistors and a strong VGs at high $V_{DDH}$ (e.g., at the SS corner). FIG. 2C is a graph showing an example of charge pump leakage versus supply voltage, and FIG. 2D is a graph showing an example of actual supply voltage received from the charge pump for different corners of the level shifter 20 of FIG. 2A. In FIG. 2C, the $V_{DDH}$ applied and $V_{DDH}$ obtained is also shown. The corresponding droop in $V_{DDH}$ (due to leakage in the level shifter 20 and/or other factors) is also shown in FIG. 2D. Leakage by the level shifter 20 can significantly affect the output voltage of charge pumps. Thus, the level shifter 20 and wordline drivers in an eDRAM, for example, may receive less than the designed-for $V_{DDH}$, degrading the writeback voltage of bitcells and degrading the retention time. Particularly, the retention time for eDRAM bitcells may be reduced because of lower than expected $V_{DDH}$ values. Among other factors, this can be attributed to incomplete writeback during read/write access because the NMOS access transistor cannot pass a full logic '1' and the bit is restored to a value much lower than 1V, for example. Thus, it can be important to carefully design the power usage of the level shifter 20. To avoid $V_{DDH}$ droop, the number of charge pumps can be increased. However, increasing the charge pumps can be associated with extra power consumption.

Figure 3A:
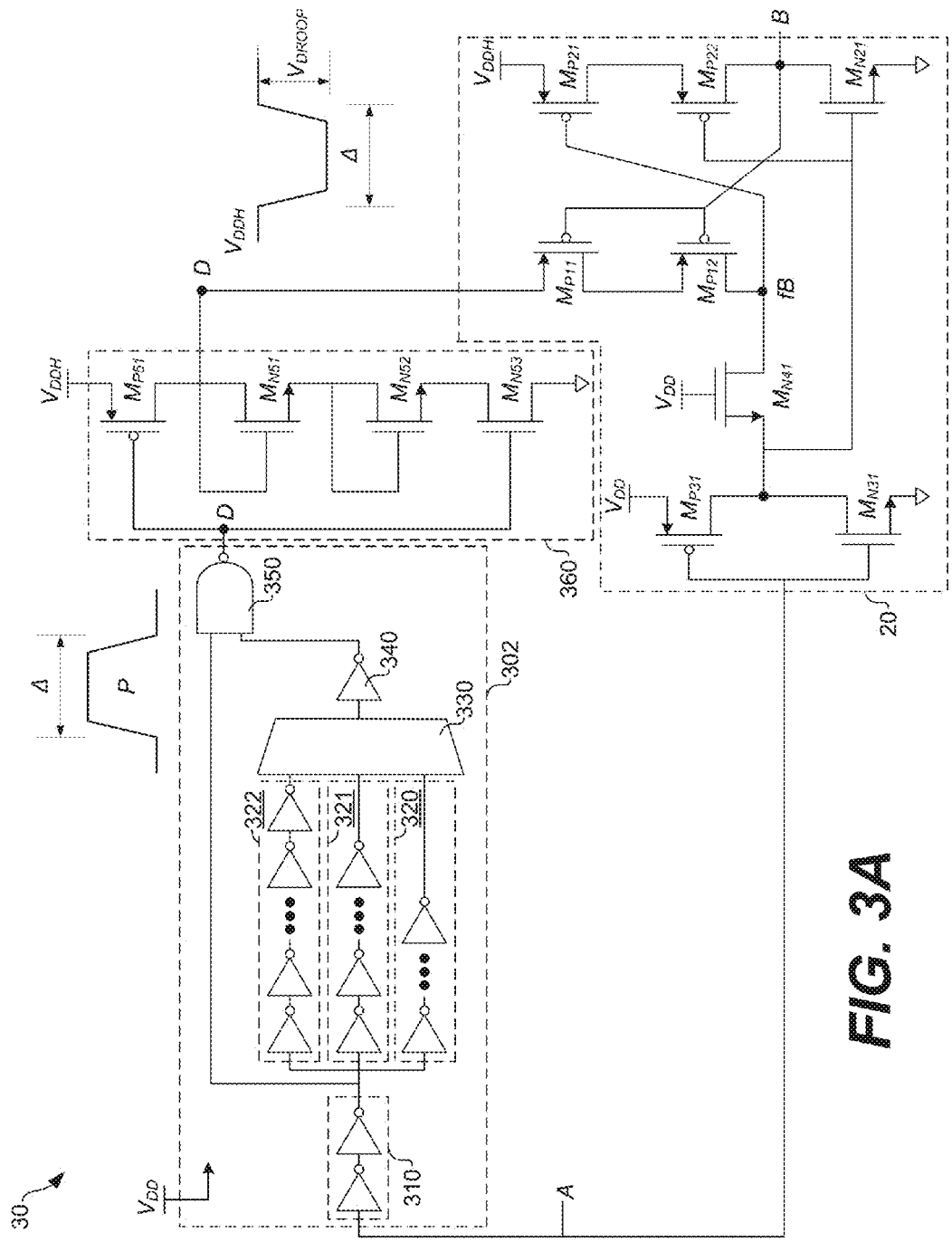
FIG. 3A is a schematic diagram of an example wide operating level shifter according to various embodiments described herein.

The delay associated with level shifter 20 can be attributed to the contention between the transistors described above. To address that contention and speed the transitions of the level shifter 20, various embodiments are described herein that improve the speed and operating range of level shifters including the level shifter 20. To begin, FIG. 3A is a schematic diagram of an example wide operating level shifter 30 according to various embodiments described herein. The level shifter 30 includes a voltage drooping circuit to address the contention between transistors in conventional level shifters. The level shifter 30 includes the level shifter 20 shown in FIG. 2A, a pulse generator 302, and a droop circuit 360. As described above, the level shifter 20 is configured to receive the input signal A in a first voltage domain (e.g., $V_{DD}$ domain) and generate an output signal in a second voltage domain (e.g., $V_{DDH}$ domain).

The pulse generator 302 is configured to generate a pulse P in response to sensing a rise transition on the input signal A, and the droop circuit 360 is configured to decouple at least a portion of the level shifter 20 from the second voltage domain V in response to the pulse P. The level shifter 30 is designed to split the supply of voltage to the first and second legs of the level shifter 20 and droops the supply voltage V provided to the feedback transistors $M_{P21}$ and $M_{P22}$ during logic transitions on the input signal A based on the pulse P. This reduces the contention at fB node and assists with the transition speed in the level shifter 30.

In the example shown in FIG. 3A, the pulse generator 302 includes delay inverters 310 coupled to strings of inverter chains 320-322. The outputs of the inverter chains 320-322 are coupled to a multiplexer 330, and the multiplexer 330 is coupled through the inverter 340 to the gate 350. The pulse generator 302 operates in the first voltage domain $V_{DD}$. In one embodiment, the first inverter chain 320 includes a series arrangement of two inverters, the second inverter chain 321 includes a series arrangement of four inverters, and the third inverter chain 322 includes a series arrangement of six inverters. In other embodiments, the pulse generator 302 can include fewer or additional inverter chains coupled to the multiplexer 330, and each of the inverter chains 320-322 can include fewer or additional inverters. In other words, the pulse generator 302 shown in FIG. 3A is provided by way of example of an arrangement of logic to generate the pulse P of width Δ upon a logic transition in the input signal A. As noted above, the design of the pulse generator 302 can vary from that shown, and other types of pulse generator circuits and/or logic can be relied upon among the embodiments.

The multiplexer 330 is similar to a logical OR operator. In operation, when the logic level of the input signal A transitions, the transition will propagate along each of the inverter chains 320-322 at different times. The width Δ of the pulse P is primarily determined based on the time required for the transition at the input signal A to propagate along each of the inverter chains 320-322. Thus, based on the number of inverter chains 320-322 and/or the number of inverters in each of the inverter chains 320-322, the width Δ of the pulse P can be shortened or lengthened. In some embodiments, the level shifter 30 can include a programmable version of the pulse generator 302. Such a programmable pulse generator can modulate the width Δ of the pulse P duration adaptively. The time difference required for the transition at the input signal A to propagate along each of the inverter chains 320-322 is compared at the gate 350, which can be embodied as a NAND gate or other suitable logic gate. The output of the gate (i.e., the pulse P) is provided to the droop circuit 360 at node D.

The droop circuit 360 includes a PMOS transistor $M_{P51}$ and a string of NMOS transistors $M_{N51}$, $M_{N52}$, and $M_{N53}$. The droop circuit 360 is configured to disconnect or decouple the $V_{DDH}$ supply from the level shifter 20 and pull the voltage of the $V_{DDH}$ supply down by a voltage $V_{DROOP}$. As shown in FIG. 3A, the pulse P is provided to the PMOS transistor $M_{P51}$ to disconnect the transistor $M_{P11}$ from $V_{DDH}$. In some embodiments, the transistor $M_{P51}$ can remain in a weakly ON state, since the pulse P is on $V_{DD}$ rail. Nevertheless, when the pulse P is in a logic "1" state, the supply of current from the $V_{DDH}$ rail through the transistor $M_{P51}$ is reduced. In that state, the voltage at the node D is clamped down to a voltage $V_{DDH}-V_{DROOP}$ for the width Δ of the pulse P. The level of the droop $V_{DROOP}$ is determined by the number of the diode-connected NMOS transistors $M_{N51}$ and $M_{N52}$ and can be altered as a design parameter. In FIG. 3A, the NMOS transistors $M_{N51}$ and $M_{N52}$ clamp $V_{DDH}-V_{DROOP}$ to two threshold voltages (i.e., $2V_{TN}$) above ground. This can be done to ensure fast pull-back and lower static power. The number of diode-connected NMOS transistors in the droop circuit 360 can be dynamically adjusted in certain embodiments to control the magnitude of $V_{DROOP}$.

Figure 3B:
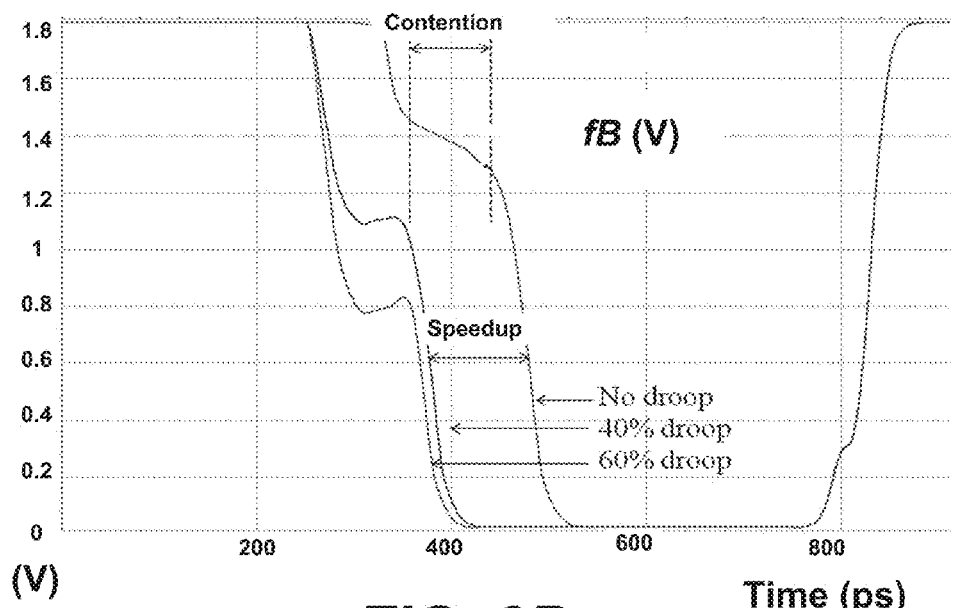
FIG. 3B shows simulated waveforms illustrating an example of contention mitigation using a pulse generator and droop circuit in the level shifter shown in FIG. 3A according to various embodiments described herein.

FIG. 3B shows simulated waveforms illustrating an example of contention mitigation using the pulse generator 302 and the droop circuit 360 in the level shifter 30 shown in FIG. 3A. Three waveforms at the feedback node fB are shown in FIG. 3B, including 0, 40%, and 60% $V_{DDH}$ droop. FIG. 3B shows the reduction in the contention at the feedback node fB when the width Δ of the pulse P is 100 ps. In order to estimate the benefits offered by the level shifter 30 under process variations, 5000 Monte Carlo points with 60% droop and a Δ of 100 ps were simulated for all process corners and $V_{DDH}$ values.

Figure 3C:
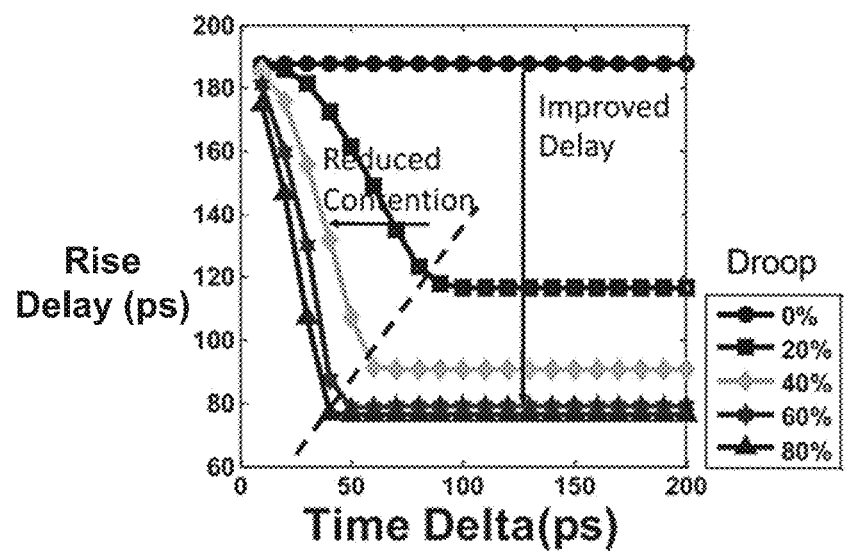
FIG. 3C is a graph showing an example of worst case delay versus pulse width for different amounts of droop in the level shifter shown in FIG. 3A according to various embodiments described herein.

FIG. 3C is a graph showing an example of the worst case delay versus pulse width for different amounts of droop in the level shifter 30 shown in FIG. 3A. Both the magnitude and the duration of $V_{DDH}$ droop can determine, at least in part, the propagation delay of the level shifter 30 as shown. A narrow pulse does not necessarily improve delay significantly because the droop time can be insufficient to fully mitigate the contention. FIG. 3C also illustrates the rise delay versus pulse duration for different amounts of droop. FIG. 3C shows that the droop saturates after 40%, because the contention might already be mitigated and thus the extra drooping does not necessarily help improve the delay. The results using a pulse width of more than 50-100 ps can be similar. The regions dominated by contention and PMOS pull-up are also indicated in FIG. 3C.

Figure 3D:
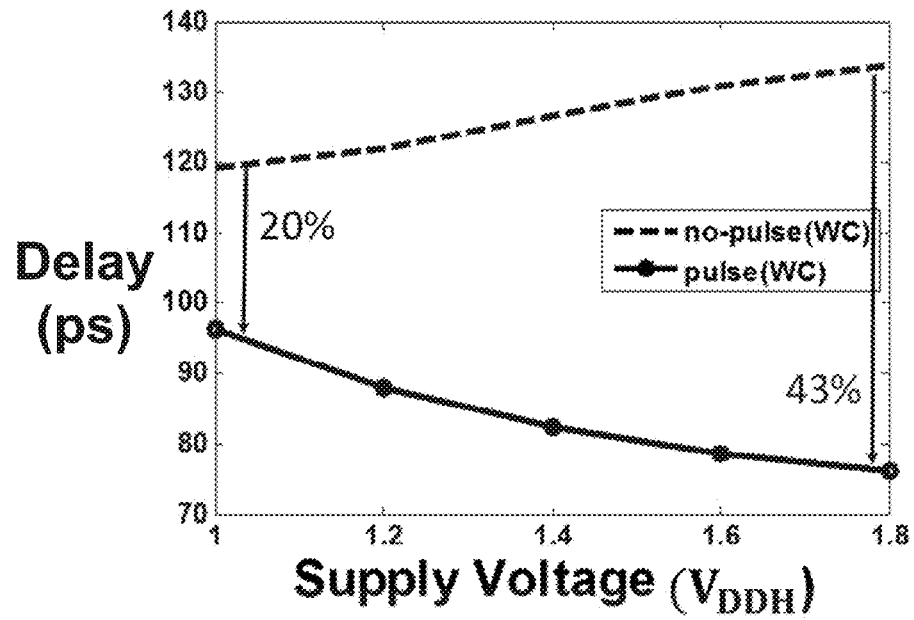
FIGS. 3D and 3E are graphs showing an example of the worst case delay points over a voltage range in the level shifter shown in FIG. 3A according to various embodiments described herein.
Figure 3E:
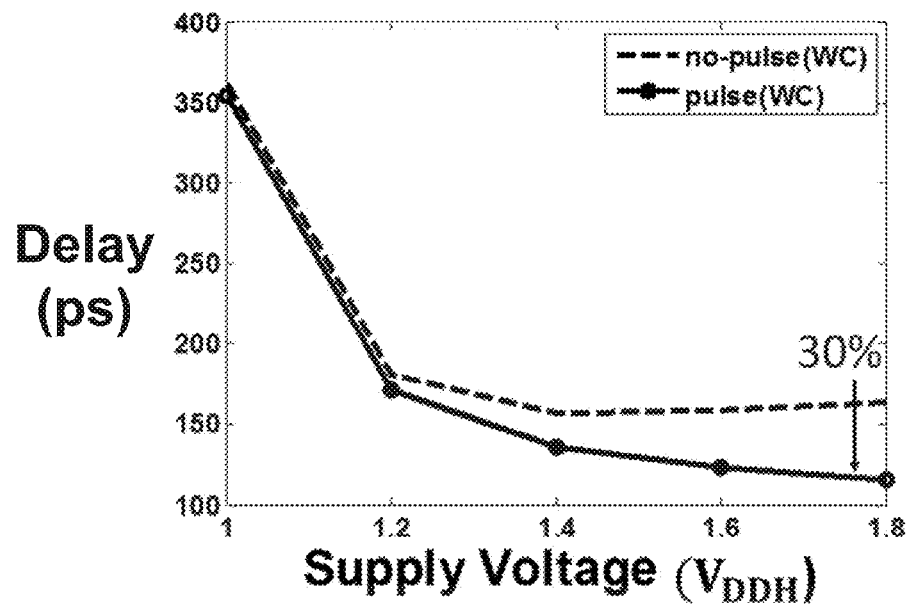

FIGS. 3D and 3E are graphs showing examples of the worst case delay points for a voltage range of about 1V to 1.8V in the level shifter 30 shown in FIG. 3A. Particularly, the worst case rise delays for the SF and SS corners (which are worst case corners in terms of rise delay) are shown in FIGS. 3D and 3E. For the sake of comparison, the worst case of level shifter 20 (i.e., with no pulse) is also plotted in FIGS. 3D and 3E. As much as a 30% reduction in the worst case rise delay is possible at $V_{DDH}$=1.8V at the SS corner in the level shifter 30. The delay is relatively sensitive to the amount of droop, and the width Δ of the pulse P also impacts the speed of the level shifter 30.

In some embodiments, the pulse generator 302 and the droop circuit 360 can be shared among about 64 level shifters to minimize the area overhead. In that case, the area overhead of the droop circuit 360 can be less than about 1% because it is shared by about 64 level shifters in a subarray. The power overhead can also be minimal. The level shifter 30 can be designed to generate the pulse P only on rising logic transitions of the input signal A because the worst case delay of the level shifter 20 can be dominated by rise delay. Also, generating the pulse P does not necessarily help fall transitions due to the absence of contention in the falling edge.

Figure 3F:
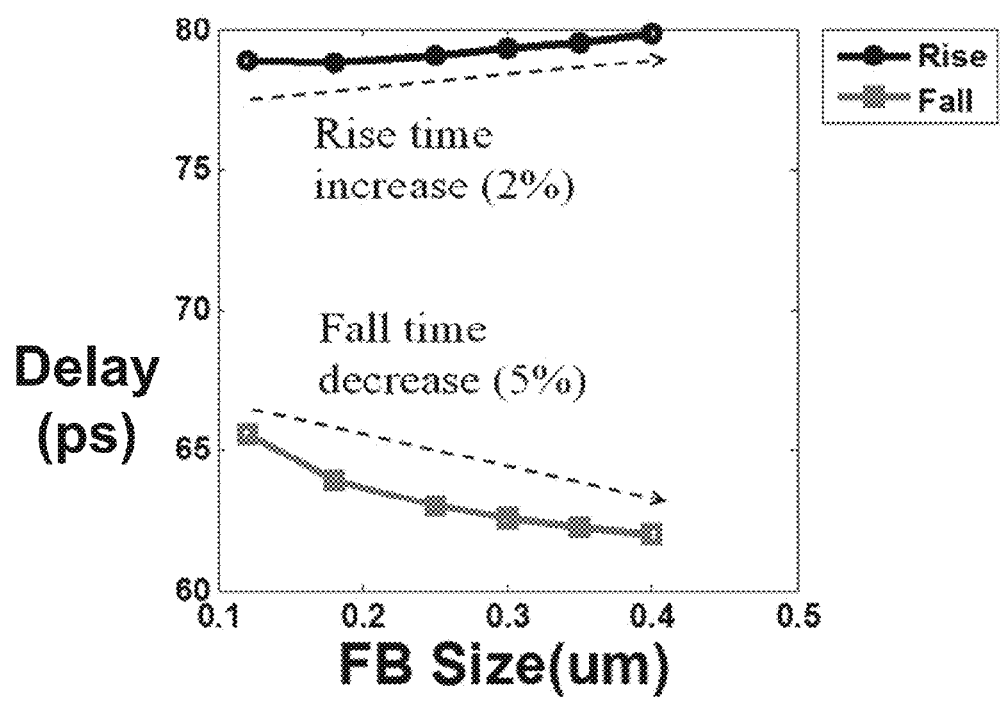
FIG. 3F is a graph showing an example of the trade-off between rise and fall delay in the level shifter shown in FIG. 3A according to various embodiments described herein.

The techniques used to reduce the delay time in the level shifter 30 provide an opportunity to make trade-offs between rise and fall delay times. This can be achieved by upsizing the feedback PMOS transistors $M_{P11}$ and $M_{P12}$ which turn-off $M_{P21}$ quickly so that $M_{N21}$ can pull-down easily. The corresponding effect on rise time can be minimal since the contention is fully eliminated through pulsing. FIG. 3F is a graph showing an example of the trade-off between rise and fall delay by feedback transistor upsizing in the level shifter 30 shown in FIG. 3A. In other words, FIG. 3F illustrates the rise and fall delay with upsizing of feedback transistors. The fall delay improvement can be minimal since $M_{P22}$ already weakens pull-up strength.

As discussed above, leakage power of level shifters can cause retention time problems in eDRAM designs, for example, among other memory circuits. To address those problems, power gated level shifters can be relied upon. In an eDRAM, for example, level shifters coupled to inactive decoders can be placed in sleep mode to mitigate leakage. Sleep mode can be achieved through supply gating, ground gating, or both. In some embodiments, supply gating is selected because it provides better leakage savings, particularly at higher $V_{DDH}$ voltages as compared to ground gating (which can show slightly better results for low $V_{DDH}$). A gated level shifter can improve the output voltage provided by charge pumps due to lower leakage.

The selection of the size of the gating sleep transistors can be an important factor in wakeup time for level shifters. To determine a reasonable size, wakeup times verses gating sleep transistor widths can be compared. In one embodiment, 9 um can be chosen as a sleep transistor size to minimize wakeup delay. In an eDRAM, the sleep signal can be controlled by early subarrayselect. When a subarray is activated, the level shifter is woken up. If the level shifter wakes up late, the wordline driver will be weak and the access latency will go down. To hide wakeup latency, subarrayselect should arrive about 1 cycle early (assuming 2 GHz operating frequency). A gated level shifter can improve the output voltage provided by charge pumps due to lower leakage. This increases the retention time in eDRAM arrays as described above.

Figure 4A:
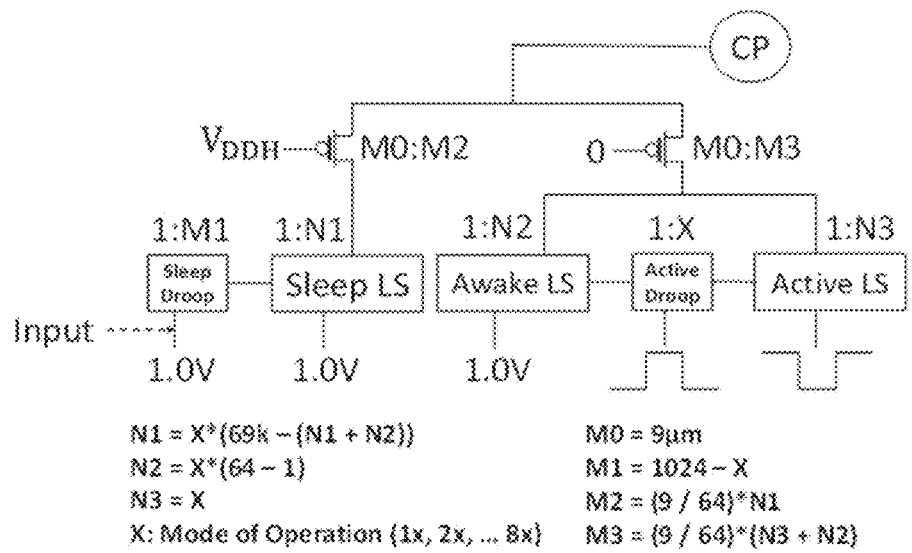
FIG. 4A is an example simulation model showing level shifter cycle and droop circuits for a low-power level shifter design using power gating according to various embodiments described herein.

FIG. 4A is an example simulation model showing level shifter cycle and corresponding droop circuits for a low-power a level shifter design using power gating. FIG. 4A also shows the system model that was used for simulation. The level shifters can be divided into three categories: awake, active, and asleep. The number of awake, active, and asleep level shifters can be determined by the access mode. For example, 1× mode can wake up 64 level shifters 110 (since they share a common sleep transistor) with one level shifter being active. The remaining level shifters can remain in sleep mode (total number of level shifters 110=69,000). Similarly, 2× can wake up 128 level shifters 110 with two level shifters 110 being active and so forth. The equations describing number of active, awake, and asleep level shifters 110 as well as PMOS power-gating sizes for each of the categories are shown in FIG. 4A. The leakage of the awake level shifters can be higher than that of asleep level shifters and can therefore present extra loads to the charge pumps. Apart from that, the level shifters which are fired can draw dynamic current. For the sake of accurate estimation of $V_{DDH}$ due to leakage, the charge pump model can also be included in the simulation.

Figure 4B:
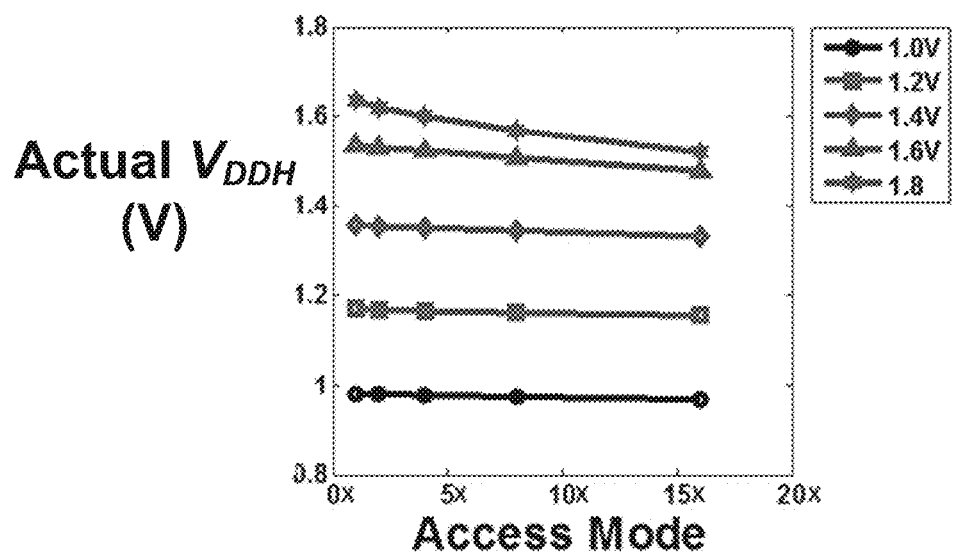
FIG. 4B is a graph showing an example of the high voltage supply obtained versus access modes for different high voltage supplies applied for low power level shifter designs using power gating according to various embodiments described herein.

FIG. 4B is a graph showing an example of the high voltage supply obtained versus access modes for different high voltage supplies. In this regard, the plot of $V_{DDH}$ obtained for different operating modes are drawn for different $V_{DDH}$ applied in FIG. 4B. A simulation was performed at 90° C. at the FF corner for worst case leakage. A total of ten charge pumps were assumed in the simulation. The $V_{DDH}$ obtained from the charge pump decreases as the access mode increases (e.g., for 8× and 16×). The access time is assumed to be 3 ns, meaning that the active bank cannot be accessed for at least about 3 ns (which is equivalent to about 12 cycles @ 4 GHz). This access period can be determined by the sense, writeback, and precharge time. In the simulation, sense time is one cycle, precharge time is one cycle, and the remaining ten cycles can be allocated for writeback.

Figure 4C:
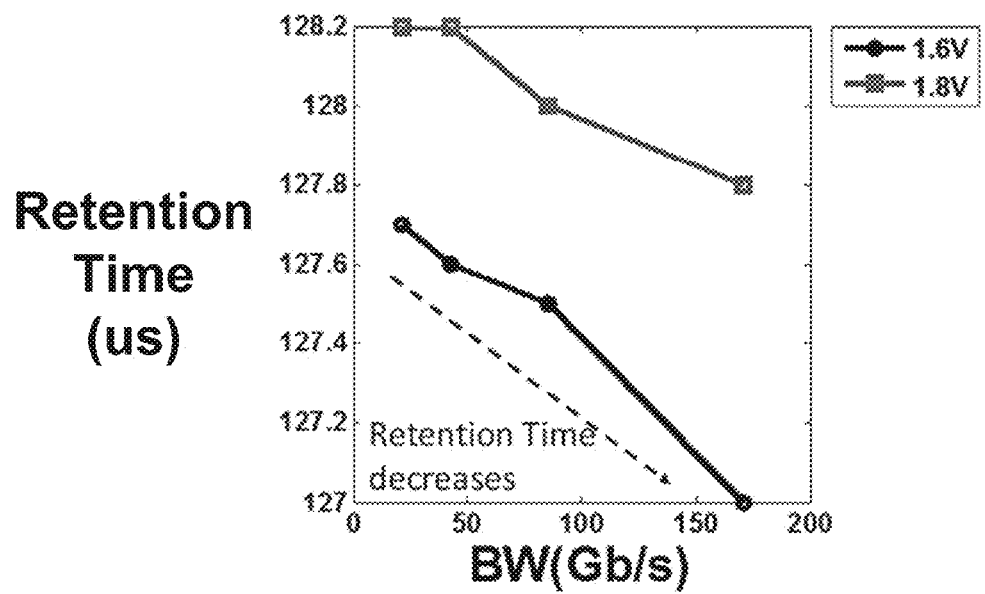
FIG. 4C is a graph showing an example of bandwidth version retention time for low-power level shifter designs according to various embodiments described herein.

FIG. 4C is a graph showing an example of bandwidth version retention time for the low-power level shifter design using power. FIGS. 4B and 4C show that 8× mode can result in maximum droop in $V_{DDH}$. This can correspond to a poor retention time. However, the bandwidth obtained can be a maximum in this case. The 1X mode can improve the retention time due to less droop in $V_{DDH}$ but the corresponding bandwidth can also be low. This indicates that higher bandwidth from the memory can be sustained by lowering the retention time, which translates to higher refresh power. This trend is further illustrated in FIG. 10C.

Figure 5A:
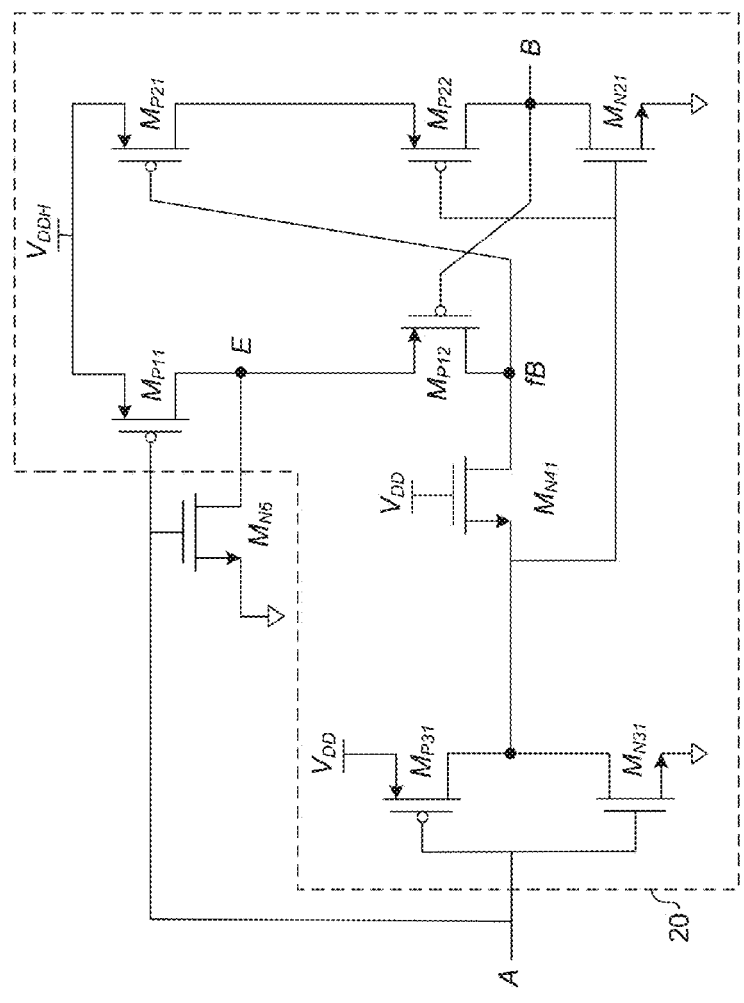
FIG. 5A is a schematic diagram of an embodiment of a self-collapsing level shifter according to various embodiments described herein.

FIG. 5A is a schematic diagram of an embodiment of a self-collapsing level shifter 40. The level shifter 40 can include an embedded drooping mechanism that disconnects the self-collapsing pulsed level shifter from a voltage supply in response to sensing a rise transition on an input signal. Particularly, the level shifter 40 includes the level shifter 20 and the level shifting clamp transistor $M_{N6}$. The drooping can be achieved by grounding the drain terminal of the feedback transistor $M_{P11}$ during a logic low to high transition on the input signal A using the level shifting clamp transistor $M_{N6}$. When input signal A transitions from logic low to logic high levels, the feedback transistor $M_{P11}$ can partially turn OFF and the NMOS transistor $M_{N6}$ can turn ON. This can provide the collapsing node E with a direct connection to ground, which can result in minimal contention during operation. The feedback transistor $M_{P11}$ can be weakly ON, but it can still reduce contention from $V_{DDH}$ and helps in creating droop. When the input transitions from logic high to logic low levels, the feedback transistor $M_{P11}$ can turn ON and the NMOS transistor $M_{N6}$ can turn OFF.

Figure 5B:
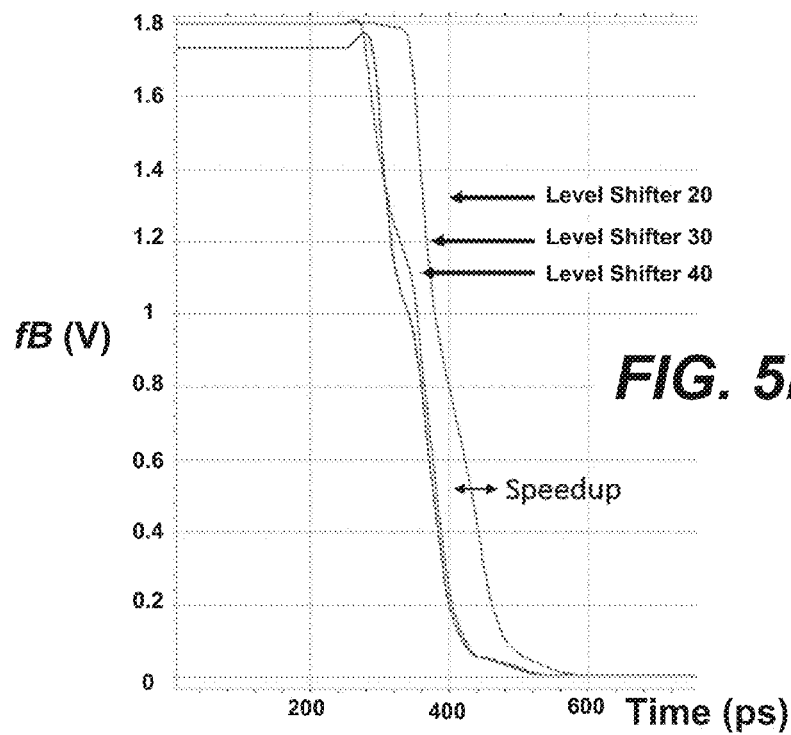
FIG. 5B shows an example waveform at a feedback node showing contention mitigation with the self-collapsing mechanism of the level shifter shown in FIG. 5A according to various embodiments described herein.
Figure 5C:
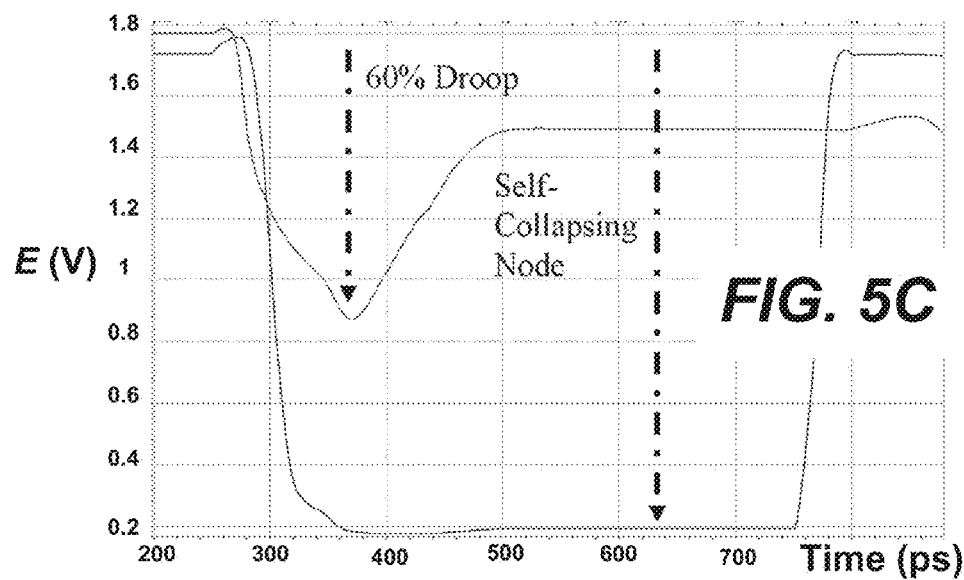
FIG. 5C shows an example circuit simulation illustrating the functionality of the self-collapsing mechanism of the level shifter shown in FIG. 5A according to various embodiments described herein.

FIG. 5B shows an example waveform at the feedback node fB showing contention mitigation with the self-collapsing mechanism of the level shifter 40 in FIG. 5A, and FIG. 5C shows an example circuit simulation illustrating the functionality of the self-collapsing mechanism of the level shifter 40 in FIG. 5A. That is, the waveform of the feedback node fB and collapsing node E obtained through circuit simulation are illustrated in FIGS. 5B and 5C, respectively. The design of the level shifter 40 is compared with the level shifter 20 and the level shifter 30 models by simulating 5000 Monte Carlo points under process variation at worst case conditions. The level shifter 20 and the level shifter 30 were found to experience its worst case rise delay from the SF and SS corners. Thus, the level shifter 40 was also simulated at the same worst case delay.

Figure 5D:
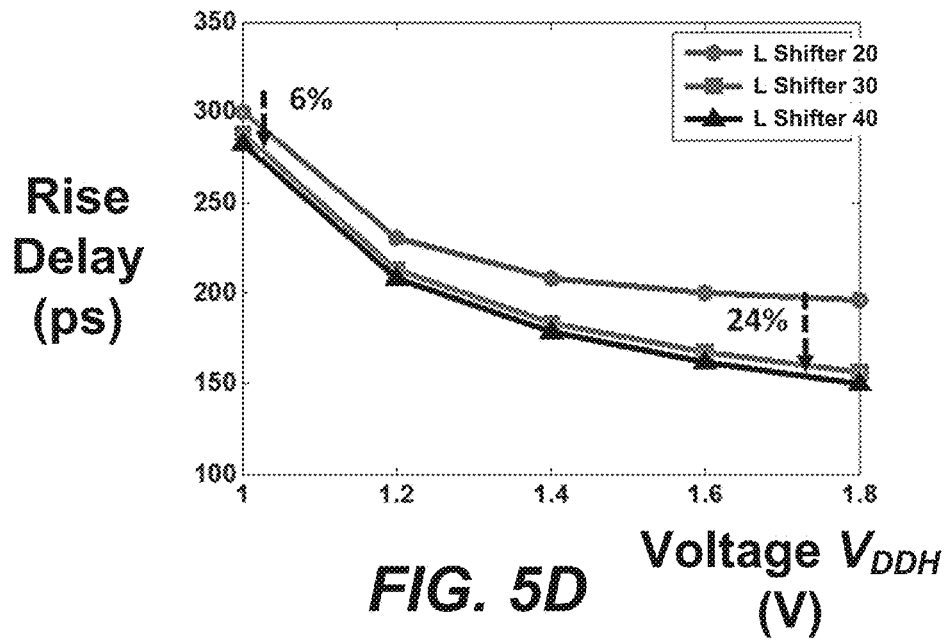
FIGS. 5D and 5E are graphs showing an example of the worst case rise delay points according to various embodiments of the level shifter designs described herein.
Figure 5E:
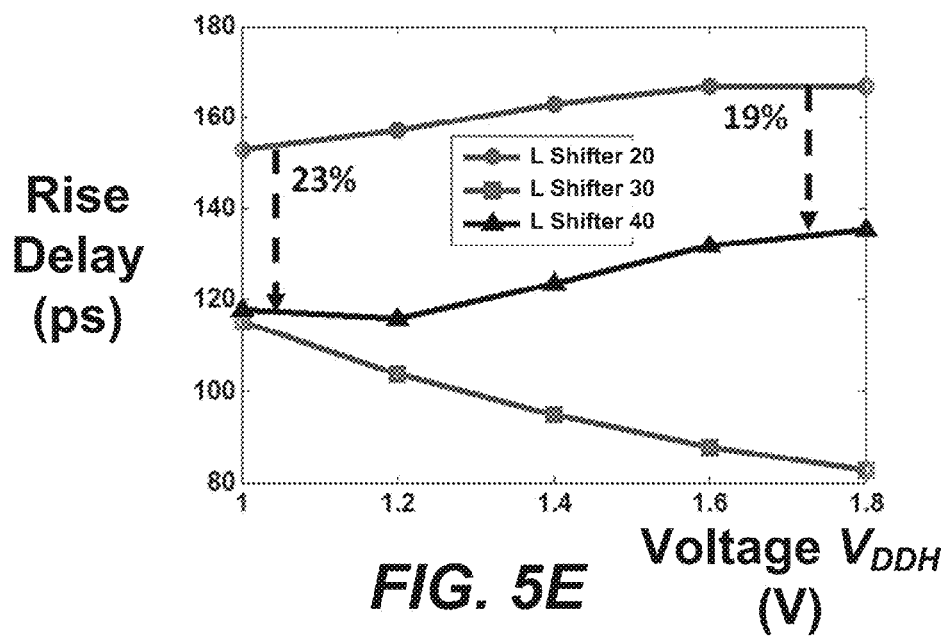

FIGS. 5D and 5E are graphs showing an example of the worst case rise delay points according to various embodiments of the level shifter designs. The SS and SF worst case corner can be seen in FIGS. 5D and 5E. The worst case of the level shifter 20 and level shifter 30 is also plotted for the sake of comparison. Compared to the level shifter 20, the proposed level shifter 40 experiences as much as about 6% to about 24% reduction in its worst case rise delay at $V_{DDH}$=1.0V-1.8V at the SS corner. FIG. 5E shows that that level shifter 40 reduction in worst case rise delay gets saturated from about 1.2V-1.8V. This is because the PMOS transistor $M_{P11}$ (FIG. 5A) is no longer connected as a feedback from the output of the level shifter 20. The level shifter 40 can experience about a 24% reduction in its worst case rise delay at $V_{DDH}$ of about 1.8V at the SF corner.

Figure 5F:
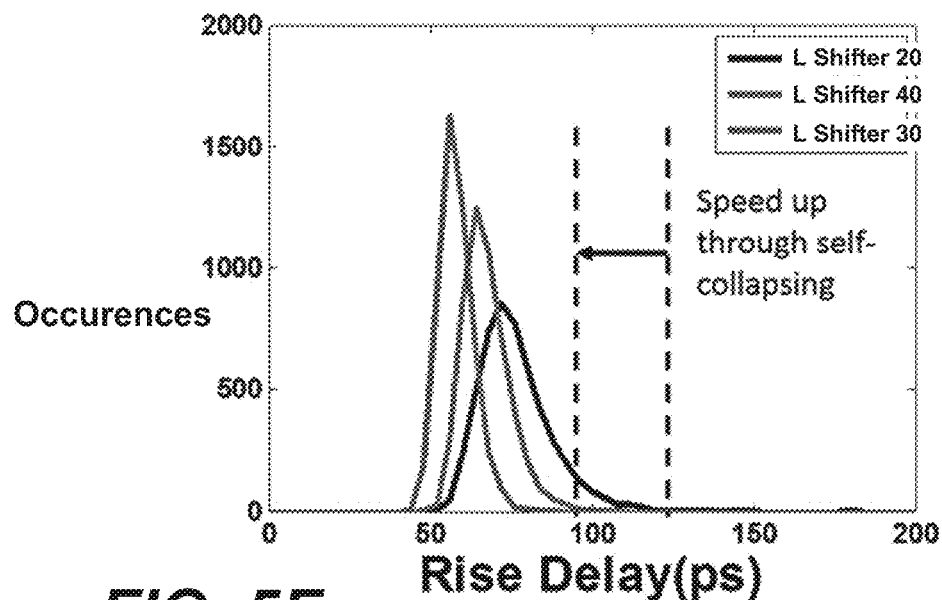
FIGS. 5F and 5G are graphs showing an example of the corresponding delay distributions for the worst case rise delay points shown in FIGS. 5D and 5E, respectively.
Figure 5G:
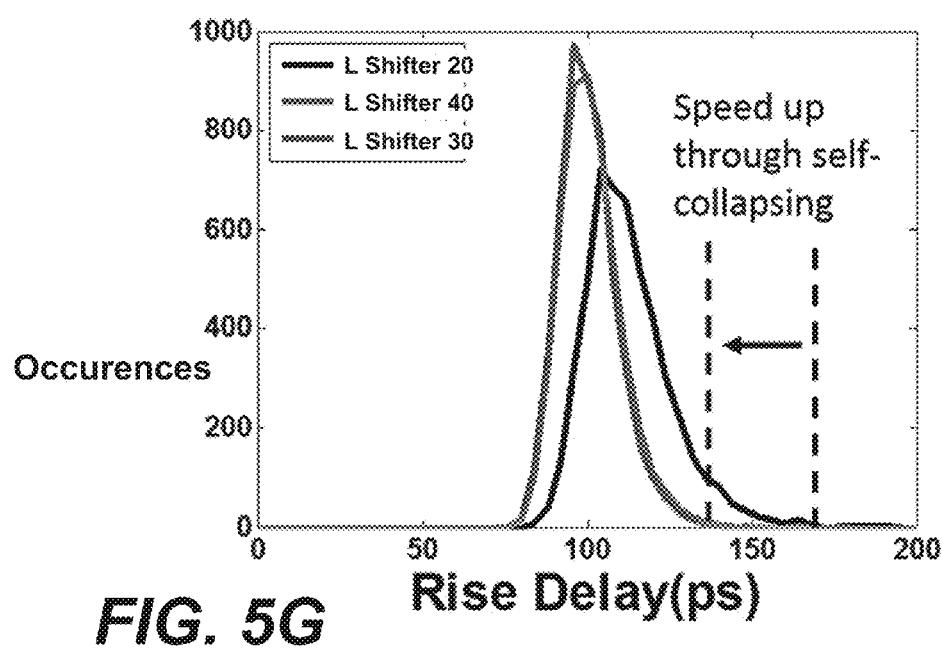

FIGS. 5F and 5G are graphs showing an example of the corresponding delay distributions for the worst case rise delay points shown in FIGS. 5D and 5E, respectively. More specifically, FIGS. 5F and 5G show the histogram of the rise delay distribution with level shifter 40 for the SS and SF corners. The distribution of the level shifter 20 and the level shifter 30 are also illustrated for the sake of comparison. A worst case analysis for the fall delay of the level shifter 40 shows that the falling transition is not affected by the proposed self-collapsing mechanism. The level shifter 40 can be found to have a worst case fall delay at SS corner.

Figure 5H:
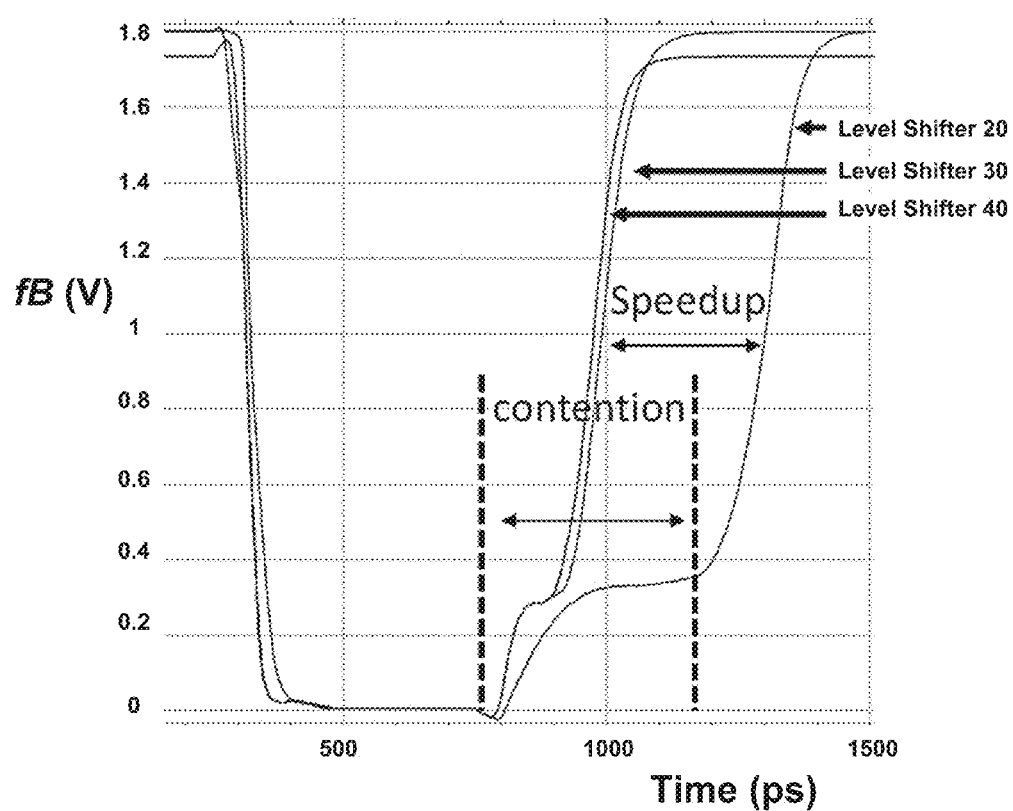
FIG. 5H shows an example waveform at a feedback node according to various embodiments of the level shifter designs described herein.

FIG. 5H shows an example waveform for a feedback node according to various embodiments of the level shifter designs. When the driving PMOS transistor $M_{P31}$ experiences high threshold voltage, it can cause the inverter to provide a very slow rising transition to the level shifter 20. The slow rising transition can create heavy contention on the feedback node fB during a down conversion (1-0). This contention can be seen by level shifter 20 in FIG. 5H. According to various embodiments, the level shifter 20 can employ low threshold voltage on the PMOS transistor $M_{P21}$ to mitigate this contention. FIG. 5H also indicates that the low threshold voltage can mitigate the contention.

Figure 5I:
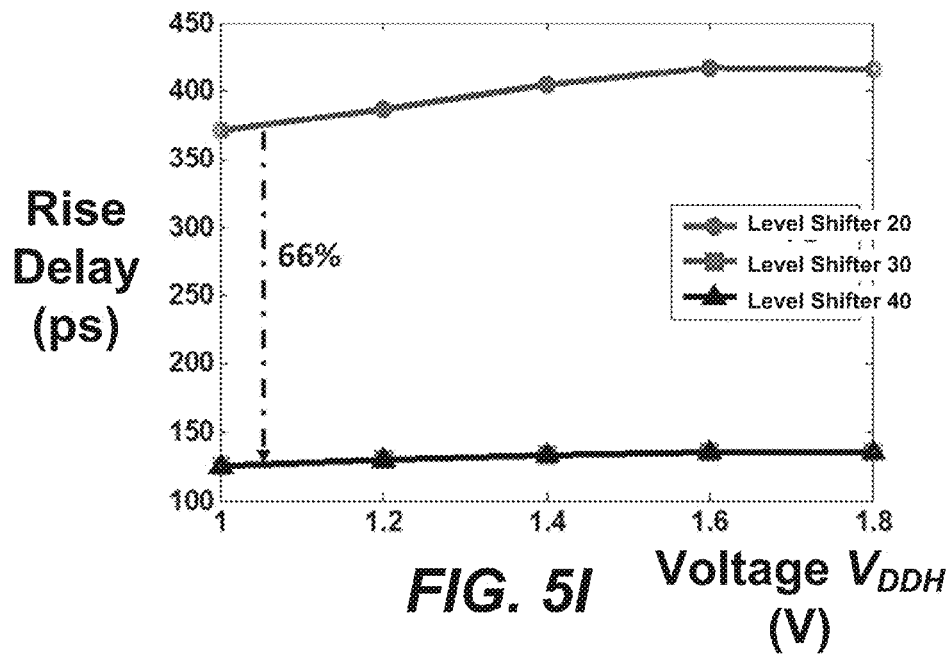
FIG. 5I shows an example circuit simulation of worst case fall delay points according to various embodiments of the level shifter designs described herein.

FIG. 5I shows an example circuit simulation of the worst case fall delay points according to various embodiments of the level shifter designs. The fall delay of the level shifter 40 can be compared by simulating 5000 Monte Carlo points under process variation with worst case conditions. The SS corner with worst case fall delay points can be noted in FIG. 5I. For the sake of comparison, the worst case fall delay of level shifter 20 and the level shifter 30 are also plotted. As much as about a 66% reduction in fall delay is possible at $V_{DDH}$ of about 1.8V at the SS corner with the proposed threshold voltage reduction.

Figure 5J:
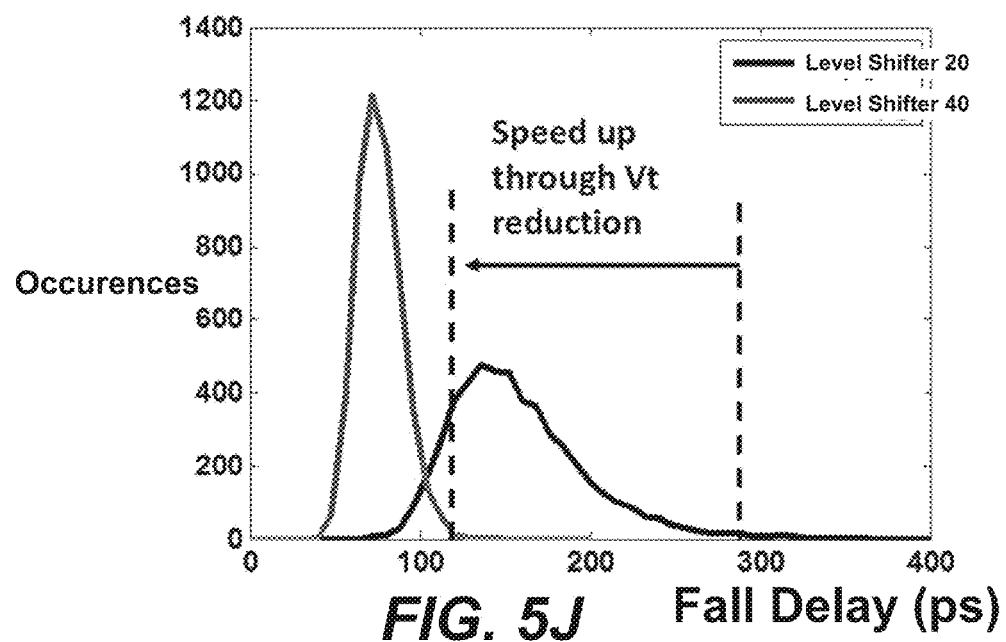
FIG. 5J is a graph showing an example of the corresponding delay distribution for the worst case fall delay points shown in FIG. 5I.

FIG. 5J is a graph showing an example of the corresponding delay distribution for the worst case fall delay points shown in FIG. 5I. Specifically, FIG. 5J shows the histogram of the fall delay distribution with level shifter 40 at the SS corner. The distribution of the level shifter 20 is also displayed for comparison. The level shifter 40 does not necessarily pose a significant area overhead. In comparison to the level shifter 20, there is about <0.1% extra area overhead because the level shifter 20 requires one extra transistor.

Figure 6A:
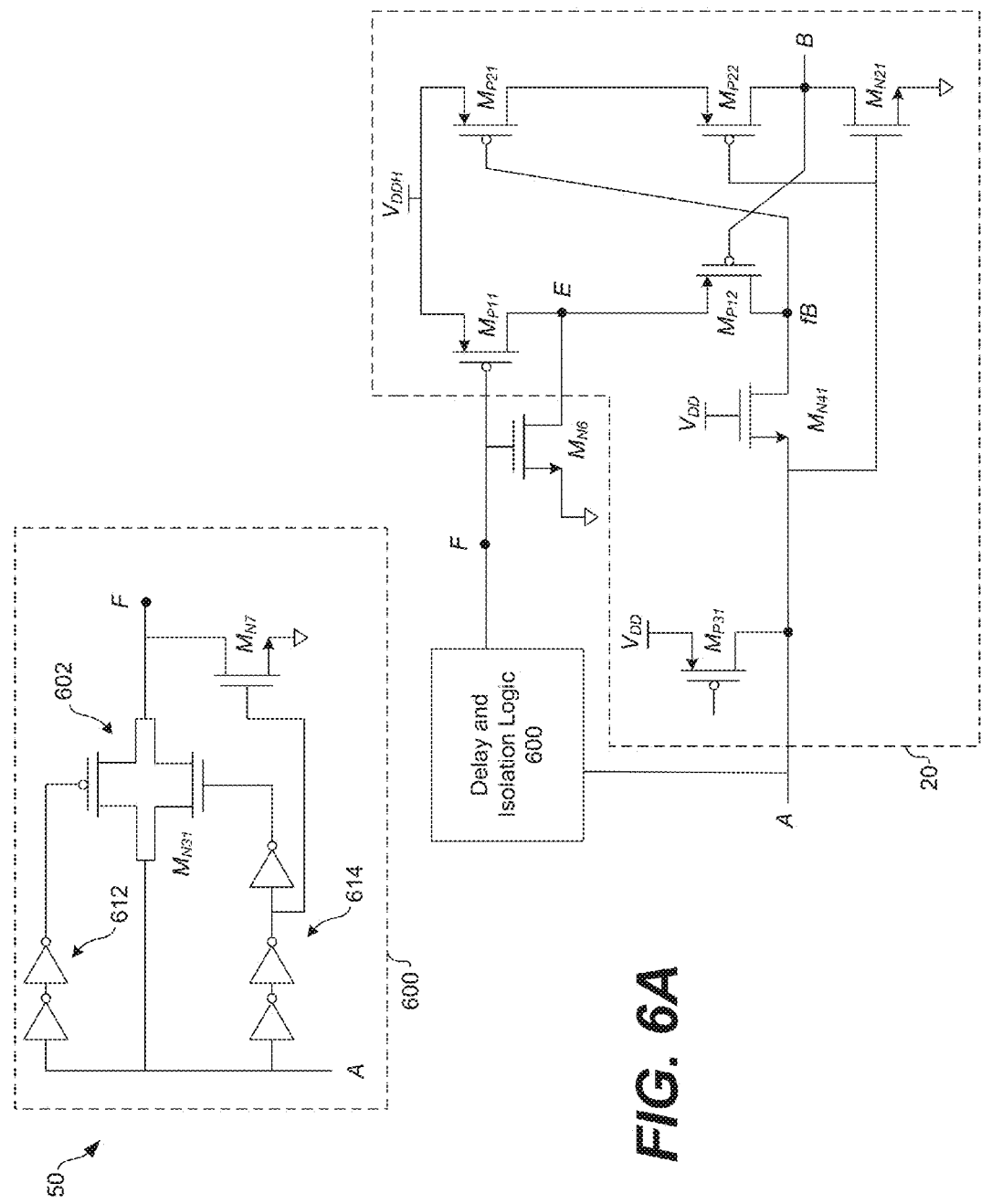
FIG. 6A is a schematic diagram of an embodiment of a low power self-collapsing level shifter according to various embodiments described herein.

The level shifter 40 can experience static power consumption between the transistors $M_{P11}$ and $M_{N6}$ when the transistor $M_{N6}$ is ON. To prevent that the static current generated in the level shifter 40. FIG. 6A is a schematic diagram of an embodiment of a low power self-collapsing level shifter 50, which allows the node E to be collapsed only for a brief period of time after which the level shifting clamp transistor $M_{N6}$ is turned OFF. The level shifter 50 includes the level shifter 20, the level shifting clamp transistor $M_{N6}$, and delay and isolation logic 600. The delay and isolation logic 600 is configured to reduce the generation of static current through the transistor $M_{P11}$ and the level shifting clamp transistor $M_{N6}$.

As shown in FIG. 6A, the delay and isolation logic 600 includes an isolation multiplexer 602 to pass or disconnect the input signal A from the transistor $M_{N6}$. The delay and isolation logic 600 also includes two inverter chains 612 and 614 to control the isolation multiplexer 602. The inverter chains 612 and 614 delay a control signal to the isolation multiplexer 602 based on the input signal A. During low to high logic transitions, the transistors $M_{P11}$ and $M_{N6}$ receive the input signal A through the isolation multiplexer 602 until the delayed control signal from the inverter chains 612 and 614 stops passing the input signal A and turns the NMOS transistor $M_{N7}$ ON. This ensures that the transistors $M_{P11}$ and $M_{N6}$ are turned OFF. The delay circuit can fully operate on the $V_{DD}$ rail and does not need level conversion. The inverters in the inverter chains 612 and 614 can be stacked or adaptive delayed to increase the droop period of the node E. Low threshold voltages can be employed on the isolation multiplexer 602 to minimize propagation delay.

Figure 6B:
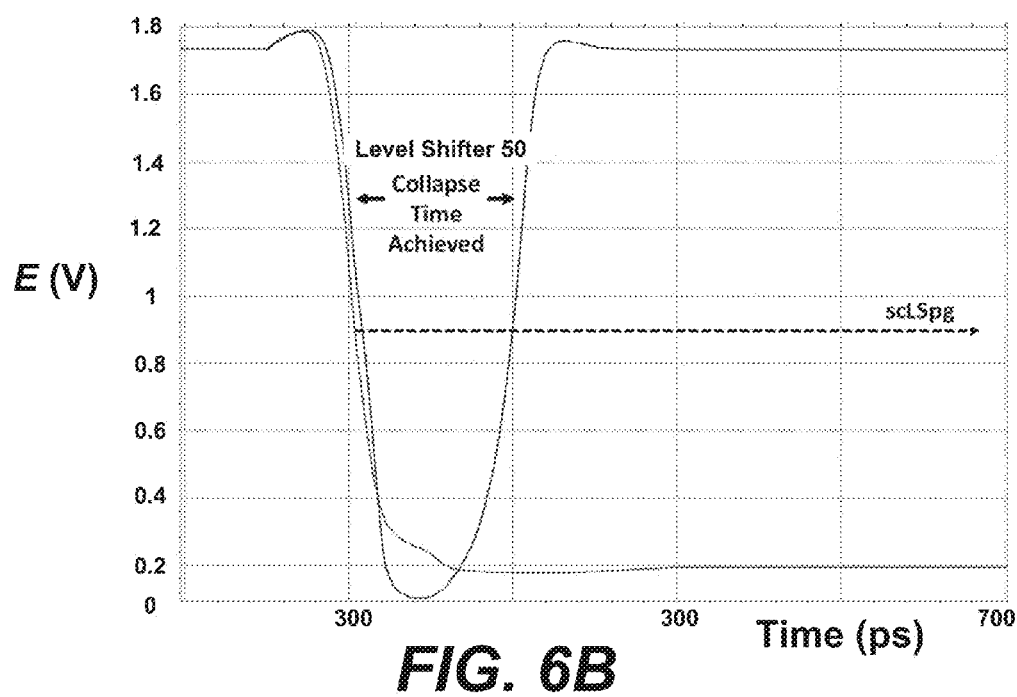
FIG. 6B shows an example circuit simulation of the level shifter shown in FIG. 5A compared to an example circuit simulation of the level shifter shown in FIG. 5A according to various embodiments described herein.
Figure 6C:
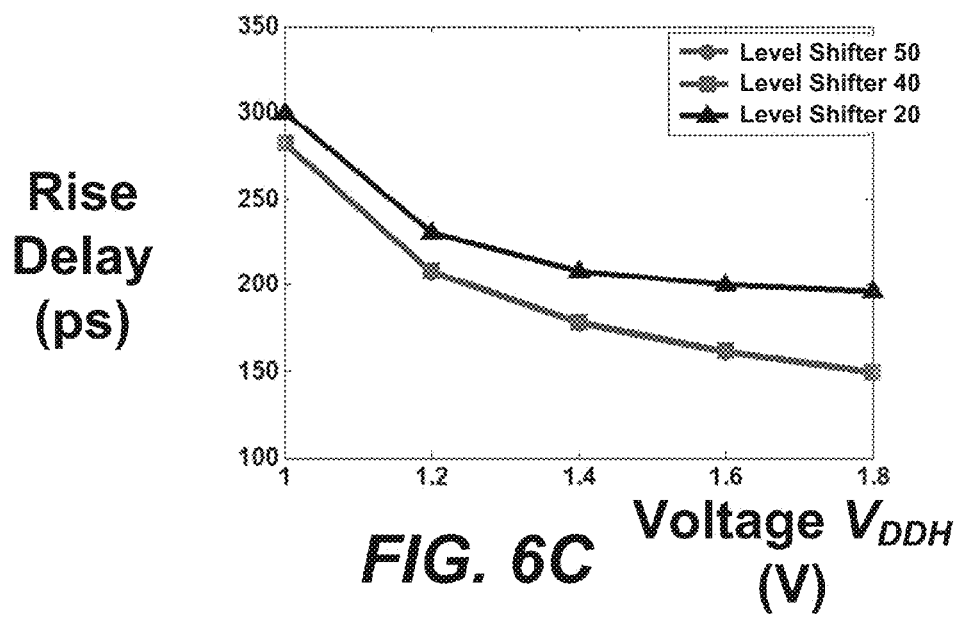
FIGS. 6C and 6D are graphs showing an example of the worst case rise delay and fall delay points for an embodiment of the level shifter shown in FIG. 6A.
Figure 6D:
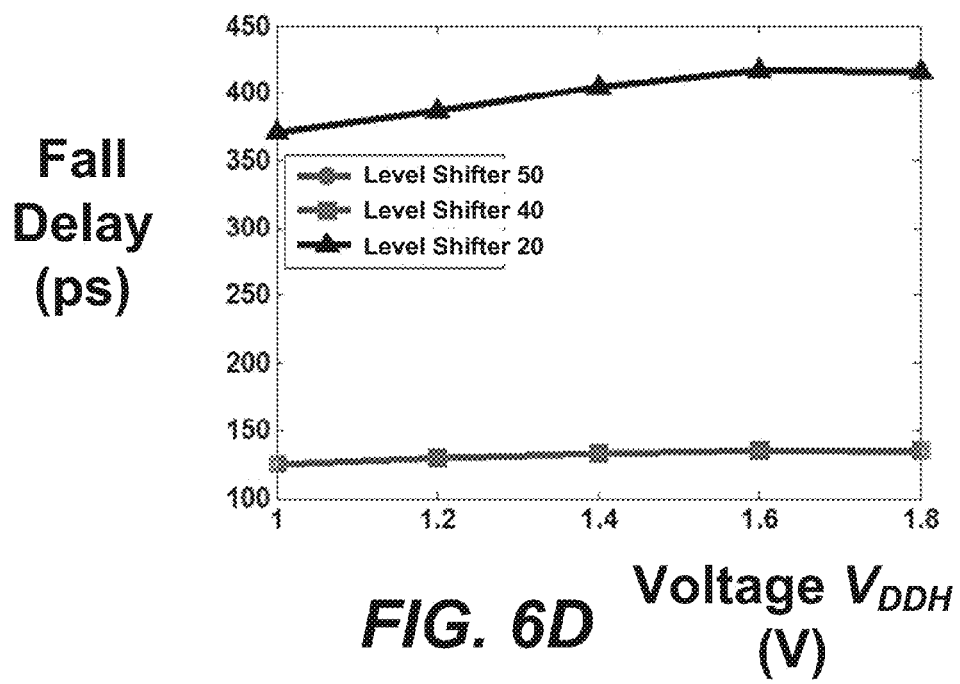

FIG. 6B shows an example circuit simulation of the level shifter 50 of FIG. 5A compared to an example circuit simulation of the level shifter 50 shown in FIG. 5A. FIG. 6B shows that the node E is collapsed for only a brief period of time. FIGS. 6C and 6D are graphs showing an example of the worst case rise delay and fall delay points for an embodiment of level shifter shown in FIG. 6A. The SS worst case rise and fall delay can be seen in FIGS. 6C and 6D. The worst case points of the level shifter 20 and level shifter 40 are also plotted for comparison. Almost no delay overhead is experienced by level shifter 50 for all simulated points.

Figure 6E:
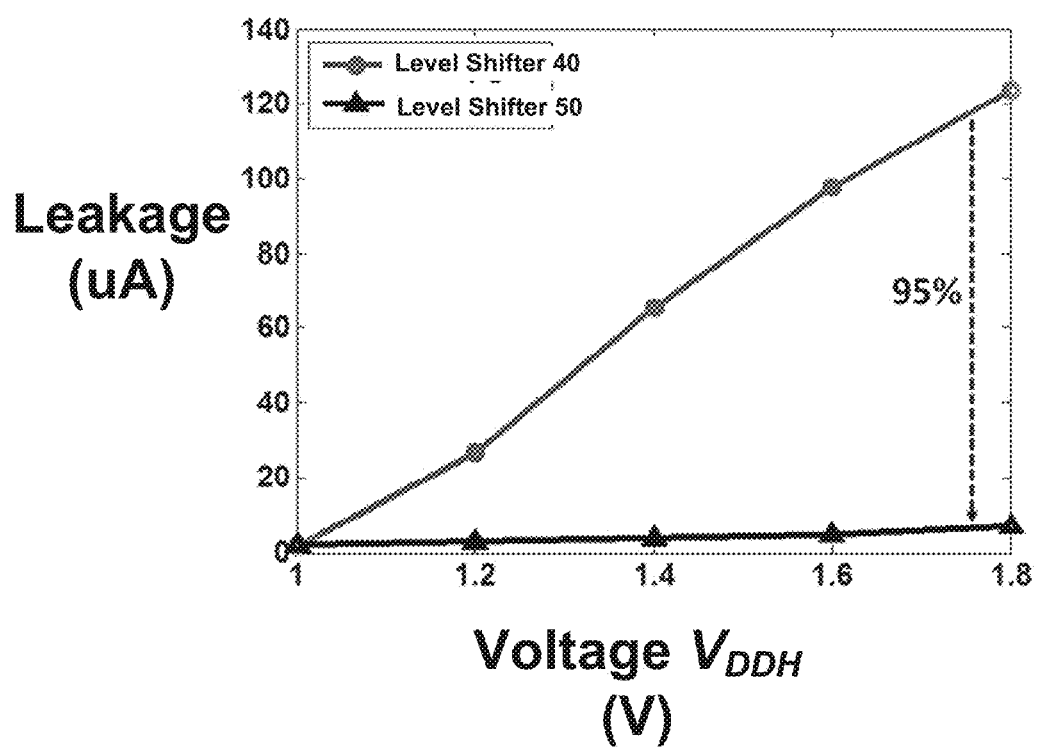
FIG. 6E is a graph showing an example comparison between the total leakage of the level shifter shown in FIG. 6A and the level shifter shown in FIG. 5A according to various embodiments described herein.

FIG. 6E is a graph showing an example comparison between the total leakage of the level shifter 50 shown in FIG. 6A and the level shifter 40 shown in FIG. 5A. The leakage consumed by level shifter 50 can be about 95% less than level shifter 40 when $V_{DDH}$ is about 1.8V at the SS corner. The area overhead of level shifter 50 compared to level shifter 20 can be about 50% due to addition of isolation multiplexers and extra inverters. Trade-off between area and delay can be made to optimize the area overhead.

Aspects of wide operating range level shifter designs are described. One embodiment includes a level shifter configured to receive an input signal in a first voltage domain and generate an output signal in a second voltage domain, a pulse generator configured to generate a pulse in response to sensing a rise transition on the input signal, and a droop circuit configured to decouple at least a portion of the level shifter from the second voltage domain in response to the pulse. According to one aspect of the embodiments, the pulse can be provided to the droop circuit to decouple at least a portion of the level shifter from the second voltage domain and reduce contention between transistors in the level shifter. Using the concepts described herein, the worst case rise time delay for level shifters can be significantly reduced.

It is understood that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

At least the following is claimed:

1. A wide operating level shifter, comprising:
a level shifter configured to receive an input signal in a first voltage domain and generate an output signal in a second voltage domain;
a level shifting clamp transistor coupled between a drain terminal of at least one transistor in the level shifter and ground, the level shifting clamp transistor being configured to clamp the at least one transistor in the level shifter to ground in response to the input signal; and
delay and isolation logic configured to reduce static current through the at least one transistor in the level shifter and the level shifting clamp transistor.

2. The wide operating level shifter of claim 1, wherein the delay and isolation logic comprises an isolation multiplexer to isolate the level shifting clamp transistor from the input signal.

3. The wide operating level shifter of claim 1, wherein the delay and isolation logic comprises:
at least one inverter chain to delay a control signal based on the input signal; and
an isolation multiplexer to isolate the input signal from the level shifting clamp transistor in response to the control signal.

4. The wide operating level shifter of claim 3, wherein the least one inverter chain is further configured to adaptively delay the control signal to the isolation multiplexer.

5. The wide operating level shifter of claim 3, wherein the at least one inverter chain comprises two inverter chains to control the isolation multiplexer.

6. The wide operating level shifter of claim 1, wherein the level shifting clamp transistor reduces contention between transistors in the level shifter.

7. The wide operating level shifter of claim 1, wherein the level shifter and the level shifting clamp transistor are employed in a memory device.

8. The wide operating level shifter of claim 1, wherein rise delay in the level shifter is reduced by about 6% to about 23% based on the at least one transistor in the level shifter being clamped to ground in response to the input signal.

9. A wide operating level shifter, comprising:
a level shifter configured to receive an input signal in a first voltage domain and generate an output signal in a second voltage domain;
a level shifting clamp transistor coupled between the input signal and the level shifter, the level shifting clamp transistor being configured to clamp a drain terminal of at least one transistor in the level shifter to ground in response to the input signal; and
delay and isolation logic configured to reduce static current through the at least one transistor in the level shifter and the level shifting clamp transistor.

10. The wide operating level shifter of claim 9, wherein the delay and isolation logic comprises an isolation multiplexer to isolate the level shifting clamp transistor from the input signal.

11. The wide operating level shifter of claim 9, wherein the delay and isolation logic comprises:
at least one inverter chain to delay a control signal based on the input signal; and
an isolation multiplexer to isolate the input signal from the level shifting clamp transistor in response to the control signal.

12. The wide operating level shifter of claim 11, wherein the least one inverter chain is further configured to adaptively delay the control signal to the isolation multiplexer.

13. The wide operating level shifter of claim 9, wherein the level shifting clamp transistor reduces contention between transistors in the level shifter.

14. The wide operating level shifter of claim 9, wherein the level shifter and the level shifting clamp transistor are employed in a memory device.

15. The wide operating level shifter of claim 9, wherein the level shifter experiences about 6% to about 23% reduction in a worst case rise delay.

16. A wide operating level shifter, comprising:
a level shifter configured to receive an input signal in a first voltage domain and generate an output signal in a second voltage domain;
a level shifting clamp transistor coupled between the input signal and the level shifter, the level shifting clamp transistor being configured to clamp a drain terminal of at least one transistor in the level shifter to ground in response to a logic low to high transition of the input signal; and
delay and isolation logic configured to reduce static current through the at least one transistor in the level shifter and the level shifting clamp transistor.

17. The wide operating level shifter of claim 16, wherein the level shifting clamp transistor reduces contention between transistors in the level shifter.

18. The wide operating level shifter of claim 16, wherein the delay and isolation logic comprises:
at least one inverter chain to delay a control signal based on the input signal; and
an isolation multiplexer to isolate the input signal from the level shifting clamp transistor in response to the control signal.

19. The wide operating level shifter of claim 18, wherein the least one inverter chain is further configured to adaptively delay the control signal to the isolation multiplexer.

20. The wide operating level shifter of claim 18, wherein the at least one inverter chain comprises two inverter chains to control the isolation multiplexer.

* * * * *